US012683594B2

(12) United States Patent
Lin

(10) Patent No.: US 12,683,594 B2
(45) Date of Patent: Jul. 14, 2026

(54) SYSTEMS AND METHODS FOR DUTY-CYCLE AND PHASE ERROR DETECTOR (DPED) WITH CHOPPING CANCELLATION TECHNIQUE

(71) Applicant: Taiwan Semiconductor Manfuacturing Company, Ltd., Hsinchu (TW)

(72) Inventor: Wei Shuo Lin, Hsinchu (TW)

(73) Assignee: Taiwan Semiconductor Manfuacturing Company, Ltd., Hsinchu (TW)

( * ) Notice: Subject to any disclaimer, the term of this patent is extended or adjusted under 35 U.S.C. 154(b) by 42 days.

(21) Appl. No.: 18/769,666

(22) Filed: Jul. 11, 2024

(65) Prior Publication Data

US 2026/0019072 A1 Jan. 15, 2026

(51) Int. Cl.
| | |
|---|---|
| *H03K 17/00* | (2006.01) |
| *H03H 11/02* | (2006.01) |
| *H03K 19/21* | (2006.01) |

(52) U.S. Cl.
CPC ........... *H03K 17/002* (2013.01); *H03H 11/02* (2013.01); *H03K 19/21* (2013.01)

(58) Field of Classification Search
CPC .. H03K 17/002; H03K 17/005; H03K 17/007; H03K 17/62; H03K 17/6221; H03K 19/20; H03K 19/21; H03H 11/02; H03H 11/04; G06F 1/04; G06F 1/06
See application file for complete search history.

(56) References Cited

U.S. PATENT DOCUMENTS

| | | |
|---|---|---|
| 6,426,649 B1 | 7/2002 | Fu et al. |
| 8,744,012 B1 | 6/2014 | Ding et al. |
| 10,756,753 B2 * | 8/2020 | Shekhar ................ H03K 19/20 |
| 11,416,021 B2 | 8/2022 | Xavier et al. |
| 2009/0002042 A1 | 1/2009 | Rausch et al. |

FOREIGN PATENT DOCUMENTS

WO       WO-98/15053 A1     4/1998

* cited by examiner

*Primary Examiner* — Long Nguyen
(74) *Attorney, Agent, or Firm* — Foley & Lardner LLP

(57) ABSTRACT

A circuit may comprise a first multiplexer, a second multiplexer, a combination of logic gates, a third multiplexer, a first low-pas filter, and a second low-pass filter. The first multiplexer can be configured to receive and select a first clock signal, a second clock signal, a third clock signal, and a fourth clock signal. Respective phases of the first to fourth clock signals are related to each other. The second multiplexer can be configured to receive and select the first to fourth clock signals. The combination of logic gates may comprise a first logic gate and a second logic gate. The combination of logic gates can be coupled to the second multiplexer and can be configured to receive the second plurality of the first to fourth clock signals. The third multiplexer can be configured to receive and select the first to fourth outputs.

20 Claims, 14 Drawing Sheets

<u>100</u>

100

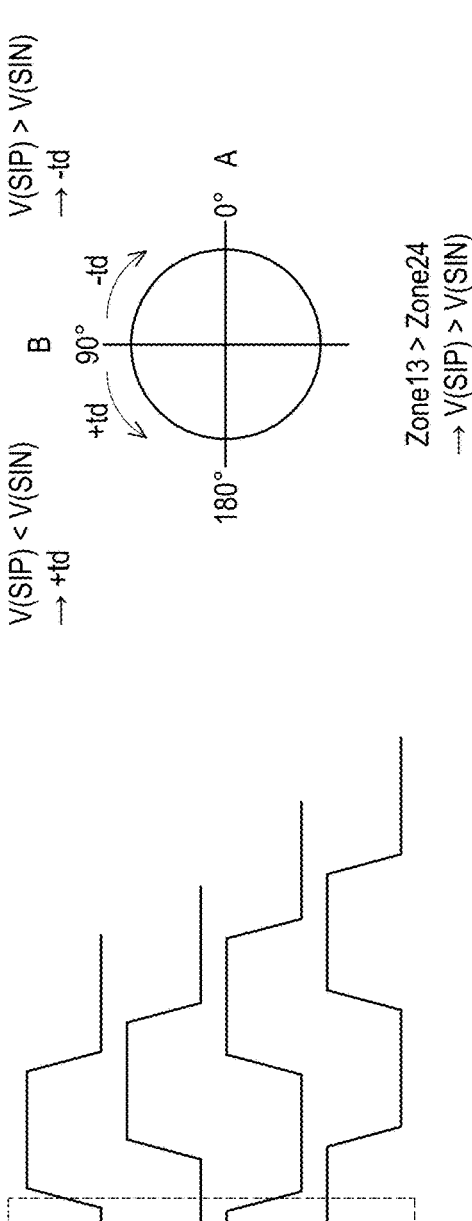

V(SIP) > V(SIN)
⟶ -td

V(SIP) < V(SIN)
⟶ +td

Zone13 > Zone24
⟶ V(SIP) > V(SIN)

| Mode | xor_A | xor_Ab | xor_B | xor_Bb | XOR | XNOR |
|------|-------|--------|-------|--------|-----|------|
| 00 | IP (0) | IN (180) | QP (90) | QN (270) | 1, 3 | 2, 4 |
| 01 | IN (180) | IP (0) | QN (270) | QP (90) | 1, 3 | 2, 4 |
| 10 | QP (90) | QN (270) | IN (180) | IP (0) | 2, 4 | 1, 3 |
| 11 | QN (270) | QP (90) | IP (0) | IN (180) | 2, 4 | 1, 3 |

Compare for MUX PN & XOR PN offset cancellation

Compare for XOR/XNOR I/Q, LPF & Slicer offset cancellation

Cancel the offset between PN mismatch

Even QP is exact 90 deg, there are some average mismatch between zone13 and zone24 due to the falling time mismatch.

FIG. 10

| DD<00> | DD<01> | DD<10> | DD<11> | PD<00> | PD<01> | PD<10> | PD<11> |
|--------|--------|--------|--------|--------|--------|--------|--------|

Provide DCC1 codes

Provide DCC2 codes

Provide QEC codes

Calibration done

Phase detect

Duty detect

FIG. 11

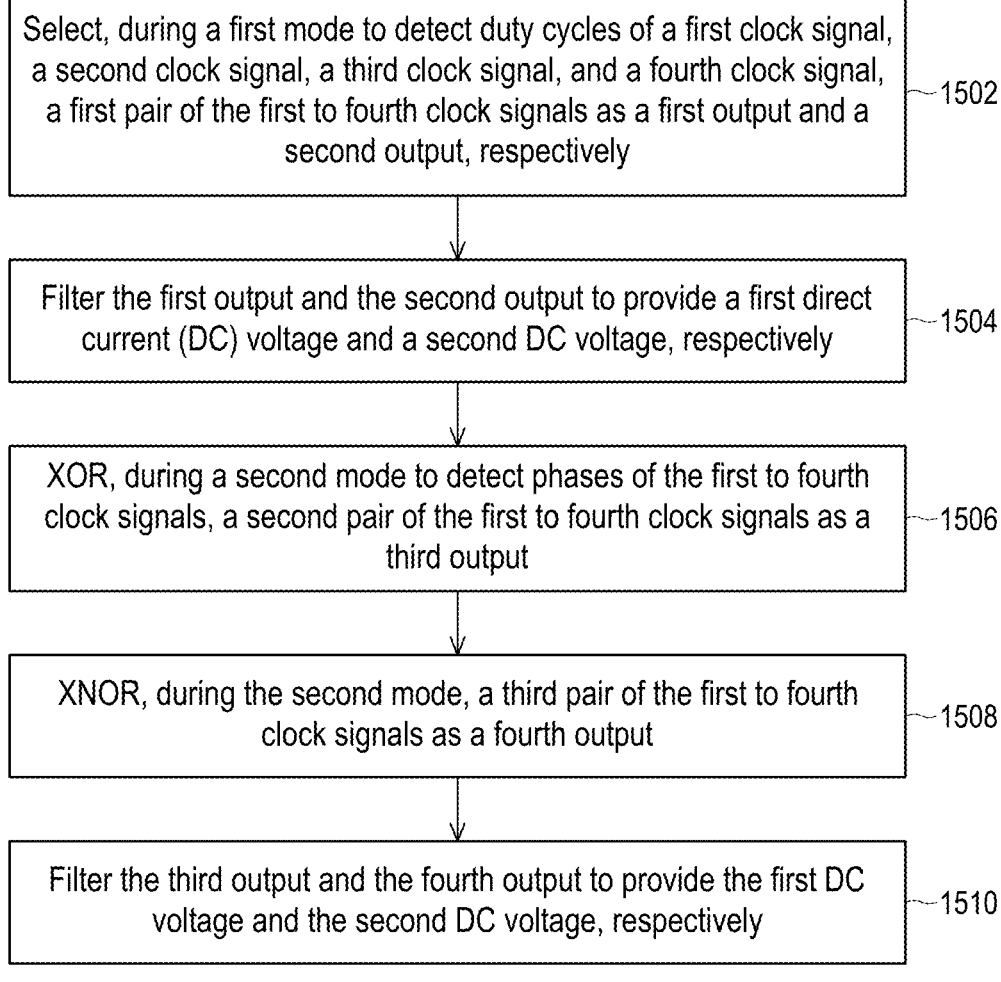

Select, during a first mode to detect duty cycles of a first clock signal, a second clock signal, a third clock signal, and a fourth clock signal, a first pair of the first to fourth clock signals as a first output and a second output, respectively ⁓1502

Filter the first output and the second output to provide a first direct current (DC) voltage and a second DC voltage, respectively ⁓1504

XOR, during a second mode to detect phases of the first to fourth clock signals, a second pair of the first to fourth clock signals as a third output ⁓1506

XNOR, during the second mode, a third pair of the first to fourth clock signals as a fourth output ⁓1508

Filter the third output and the fourth output to provide the first DC voltage and the second DC voltage, respectively ⁓1510

SYSTEMS AND METHODS FOR DUTY-CYCLE AND PHASE ERROR DETECTOR (DPED) WITH CHOPPING CANCELLATION TECHNIQUE

BACKGROUND

Standard configurations of multi-chip circuits often require that certain operations within the chips occur at precise times or within designated time frames. Typically, these circuits include timing mechanisms that supply timing signals to one or more chips. Ensuring synchronized timing across chips in a multi-chip setup can introduce challenges, which may demand relatively expensive solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates example waveforms of multiple signals for analyzing phase error, in accordance with some embodiments.

FIG. 11 illustrates an example calibration sequence for duty-cycle and phase error detector (DPED) with chopping cancellation, in accordance with some embodiments.

FIG. 15 illustrates a flow chart of an example method for operating the circuit for duty-cycle and phase error detector (DPED) with chopping cancellation of FIG. 1, in accordance with some embodiments.

DETAILED DESCRIPTION

Figure 1:
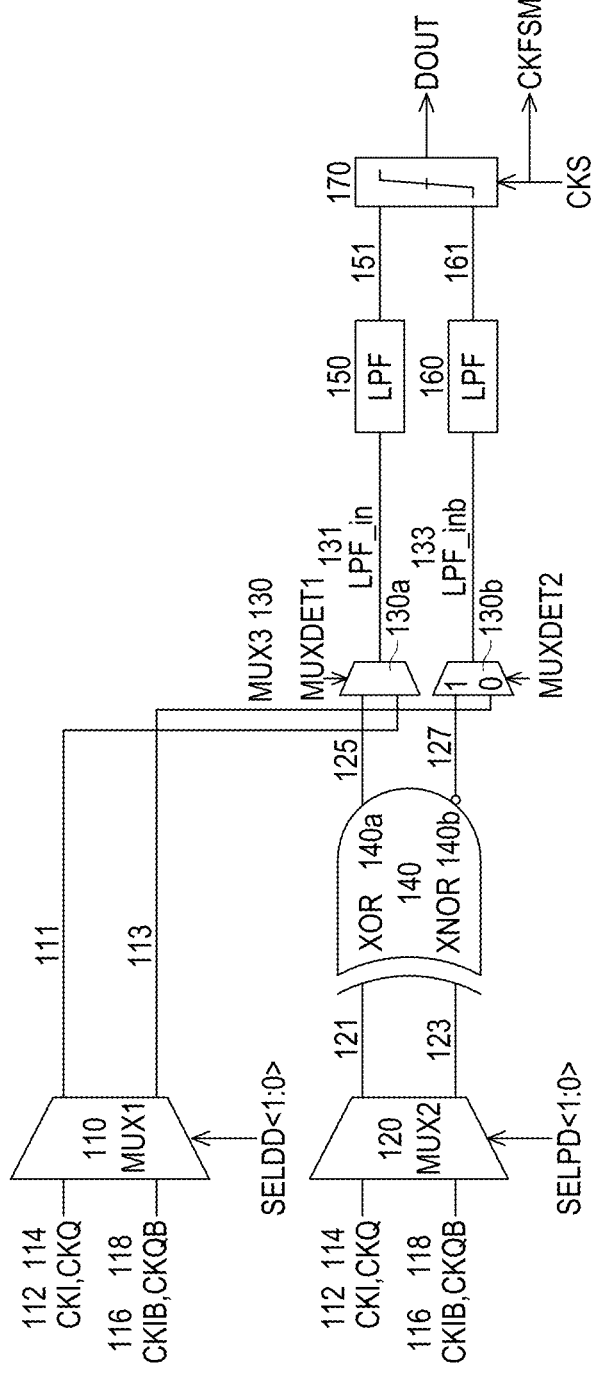
FIG. 1 illustrates an example schematic circuit diagram for duty-cycle and phase error detector (DPED) with chopping cancellation in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A duty-cycle error detector can be designed to ascertain the accuracy of a signal's duty cycle by analyzing its average direct current (DC) value, which is directly proportional to the duty cycle. To extract the duty-cycle value from a signal, a resistor capacitor (RC) filter can be employed. The RC filter effectively isolates the DC component from the overall signal, which reflects the proportion of time the signal remains high within one cycle. Subsequently, the extracted DC value can be compared using an operational amplifier. This comparison helps in determining the precision of the duty cycle, thereby identifying any discrepancies that may exist between the expected and actual values, which are critical for applications requiring precise signal processing.

A phase error detector plays a crucial role in systems where maintaining accurate phase relationships between signals is essential. In such setups, the phase error detector utilizes fully differential signals like CK_0 and CK_180, ensuring high noise immunity and precise phase measurement. However, when working with CK_90 and CK_270, which are also fully differential, adjustments may be necessary to align these signals correctly. To facilitate these adjustments, the phase error detector may compare the voltages of these signals using a slicer. Based on the outcomes of this comparison, a 1 luadrature error corrector (QEC) can be employed to control the delay time, ensuring that CK_90 and CK_270 are precisely aligned with CK_0 and CK_180. This mechanism is fundamental for systems that rely on accurate quadrature signals, such as in radio frequency (RF) and communication applications, where phase alignment directly impacts performance and signal integrity.

The present disclosure provides a circuit with duty-cycle and phase error detector (DPED) with chopping cancellation technique. Specifically, the present disclosure provides various embodiments of a circuit including a first multiplexer, a second multiplexer, a combination of logic gates, a third multiplexer, a first low-pass filter, and a second low-pass filter. The proposed duty-cycle and phase error detector (DPED) can calibrate both the duty-cycles and phase errors of two groups of differential clocks, enhancing the precision and reliability of clock signals in integrated circuits. A significant feature of the DPED is its ability to negate the effects of layout path discrepancies and device mismatches through a chopping cancellation technique. This approach ensures that the DPED can be implemented across various technology nodes, making the DPED versatile and adaptable to different manufacturing standards. For practical demonstration, the DPED may utilize two topologies of differential to quadrature phase generators—analog feedback and digital feedback. Furthermore, in this setup, the finite state machine (FSM) clock (CKS) can be derived by dividing the input clock. For example, the CKS can be set at about 500 MHz for an input clock of about 8 GHz. This configuration underscores the DPED's capability to manage high-frequency operations effectively, demonstrating its potential for broad application in modern electronic devices.

FIG. 1 illustrates an example schematic circuit diagram 100 for duty-cycle and phase error detector (DPED) with chopping cancellation in accordance with some embodiments. In the illustrated embodiment of FIG. 1, the circuit 100 may include a first multiplexer 110, a second multiplexer 120, a combination of logic gates 140, a third multiplexer 130, a first low-pass filter (LPF) 150, and a second low-pass filter (LPF) 160. Despite not being shown in FIG. 1, all of the components of the circuit 100 may be coupled to each other and to multi-chip circuits. Although, in the illustrated embodiment of FIG. 1, each component is shown as a separate block for the purpose of clear illustration, in some other embodiments, some or all of the components shown in FIG. 1 may be integrated together. For example, the second multiplexer 120 may include the combination of logic gates 140.

In some embodiments, the first multiplexer (MUX1) 110 can be an electronic device that receives, selects, and/or forwards input signals. In some embodiments, the first multiplexer 110 can be configured to receive a first clock signal (e.g., CKI) 112, a second clock signal (e.g., CKQ) 114, a third clock signal (e.g., CKIB) 116, and a fourth clock signal (e.g., CKQB) 118. The first multiplexer 110 may select a first plurality of the first to fourth clock signals 112, 114, 116, 118 as a first output 111 and a second output 113, respectively. Respective phases of the first to fourth clock signals can be related to each other. In some embodiments, the first clock signal 112 can be 0°, 90°, 180° or 270°. The second clock signal 114 can be 0°, 90°, 180° or 270°. The third clock signal 116 can be 0°, 90°, 180° or 270°. The fourth clock signal 118 can be 0°, 90°, 180° or 270°. In some embodiments, the first multiplexer 110 can be an electronic device that selects one or more of several input signals and forwards the selected input(s). In some embodiments, the first multiplexer 110 may act like a multiple-input, single-output switch, enabling multiple signals to share one device or resource, rather than requiring separate devices for each input. The first multiplexer 110 can be used in various applications to manage multiple data lines 112, 114, 116, 118 that may need to connect to a single processing unit or data stream. The selection of the input line can be controlled by additional inputs known as select lines (e.g., SELDD<1:0>). These select lines may determine which input can be connected to the output 111, 113. In some digital circuits, the first multiplexer 110 can be fundamental in reducing the number of logic gates used, managing signal routing efficiently, and/or optimizing space and resource usage in complex circuits.

In some embodiments, the second multiplexer (MUX2) 120 can be an electronic device that receives, selects, and/or forwards input signals. In some embodiments, the second multiplexer 120 can be configured to receive the first clock signal (e.g., CKI) 112, the second clock signal (e.g., CKQ) 114, the third clock signal (e.g., CKIB) 116, and the fourth clock signal (e.g., CKQB) 118. The second multiplexer 120 may select a second plurality 121, 123 of the first to fourth clock signals 112, 114, 116, 118, respectively. Respective phases of the first to fourth clock signals can be related to each other. In some embodiments, the first clock signal 112 can be 0°, 90°, 180° or 270°. The second clock signal 114 can be 0°, 90°, 180° or 270°. The third clock signal 116 can be 0°, 90°, 180° or 270°. The fourth clock signal 118 can be 0°, 90°, 180° or 270°. In some embodiments, the second multiplexer 120 can be an electronic device that selects one or more of several input signals and forwards the selected input(s). In some embodiments, the second multiplexer 120 may act like a multiple-input, single-output switch, enabling multiple signals to share one device or resource, rather than requiring separate devices for each input. The second multiplexer 120 can be used in various applications to manage multiple data lines 112, 114, 116, 118 that may need to connect to a single processing unit or data stream. The selection of the input line can be controlled by additional inputs known as select lines (e.g., SELPD<1:0>). These select lines may determine which input can be connected to the output 121, 123. In some digital circuits, the second multiplexer 120 can be fundamental in reducing the number of logic gates used, managing signal routing efficiently, and/or optimizing space and resource usage in complex circuits.

In some embodiments, the combination of logic gates 140 may comprise a first logic gate 140a and a second logic gate 140b. The combination of logic gates 140 can be coupled to the second multiplexer 120. The combination of logic gates 140 can be configured to receive the second plurality 121, 123 of the first to fourth clock signals. The combination of logic gates 140 may provide a third output 125 through the first logic gate 140a, and/or may provide a fourth output 127 through the second logic gate 140b. In some embodiments, the first logic gate 140a can be an exclusive OR (XOR) gate that outputs true or 1 only when two binary bit inputs to the XOR gate are unequal. The second logic gate 140b can be an exclusive NOR (XNOR) gate that outputs true or 1 only when two binary inputs to the XNOR are equal.

In some embodiments, the third multiplexer (MUX3, MUXDET) 130 can be configured to receive the receive the first output 111, the second output 113, the third output 125, and the fourth output 127. The third multiplexer 130 may select the first 111 and second outputs 113 or the third 125 and fourth outputs 127. In some embodiments, the third multiplexer 130 may include two multiplexers (e.g., MUXDET1, MUXDET2). In some embodiments, the MUXDET1 130a can be configured to receive the first output 111 and the third output 125. The MUXDET1 130a may select the first output 111 or the third output 125 as a fifth output (e.g., LPF_in) 131. The MUXDET1 130a may provide the fifth output 131 to the first low-pass (LPF) 150. In some embodiments, the MUXDET2 130*b* can be configured to receive the second output 113 and the fourth output 127. The MUX-DET2 130*b* may select the second output 113 or the fourth output 127 as a sixth output (e.g., LPF_inb) 133. The MUXDET2 130*b* may provide the sixth output 133 to the second low-pass filter (LPF) 160. In some embodiments, the third multiplexer 130 can be electronic device(s) that may select one or more of several input signals and may forward the selected input(s). In some embodiments, the third multiplexer 130 may act like a multiple-input, single-output switch, enabling multiple signals to share one device or resource, rather than requiring separate devices for each input. The third multiplexer 130 can be used in various applications to manage multiple data lines 111, 113, 125, 127 that may need to connect to a single processing unit or data stream. The selection of the input line can be controlled by additional inputs known as select lines. These select lines may determine which input can be connected to the output 131, 133. In some digital circuits, the third multiplexer 130 can be fundamental in reducing the number of logic gates used, managing signal routing efficiently, and/or optimizing space and resource usage in complex circuits.

In some embodiments, the first low-pass filter 150 can be configured to provide a first direct current (DC) voltage 151 based on the first output 111 and the third output 125. The low-pass filter can be an electronic circuit that allows signals with a frequency lower than a certain cutoff frequency to pass through it, while attenuating (reducing the amplitude of) signals with frequencies higher than the cutoff frequency. The point where the filter starts to attenuate the frequency is called the cutoff frequency, and it is a key characteristic that defines the behavior of the low-pass filter. Low-pass filters are used in various applications to remove high frequency noise from a signal, to extract the desired signal in communications systems, or to smooth data in data processing.

In some embodiments, the second low-pass filter 160 can be configured to provide a second DC voltage 161 based on the second output 113 and the fourth output 127. The low-pass filter can be an electronic circuit that allows signals with a frequency lower than a certain cutoff frequency to pass through it, while attenuating (reducing the amplitude of) signals with frequencies higher than the cutoff frequency. The point where the filter starts to attenuate the frequency is called the cutoff frequency, and it is a key characteristic that defines the behavior of the low-pass filter. Low-pass filters are used in various applications to remove high frequency noise from a signal, to extract the desired signal in communications systems, or to smooth data in data processing.

In certain embodiments, the circuit 100 may further include a slicer 170. The slicer 170 can be employed to compare the DC voltages 151, 161 from two low-pass filters (LPFs) 150, 160 at a rising edge of a sample clock (e.g., CKS). The slicer 170 may output a binary value (e.g., DOUT), either 1 or 0, depending on which of the two input DC voltages is higher at the moment the clock signal is high. This binary output may represent the comparison result and can be determined at each rising edge of the clock. However, when the clock signal is low, the output from the slicer 170 can be reset to ensure the system is ready for the next comparison cycle. To maintain the output level consistent and prevent it from dropping when the clock is low, a synchronous D-type flip-flop (DFF) can be integrated into the circuit 100. The DFF may capture and hold the slicer's output at the rising edge of the clock, preserving the output state until the next update cycle. In some embodiments, the slicer 170 or the DFF may provide the output value to a finite state machine (FSM).

Figure 2:
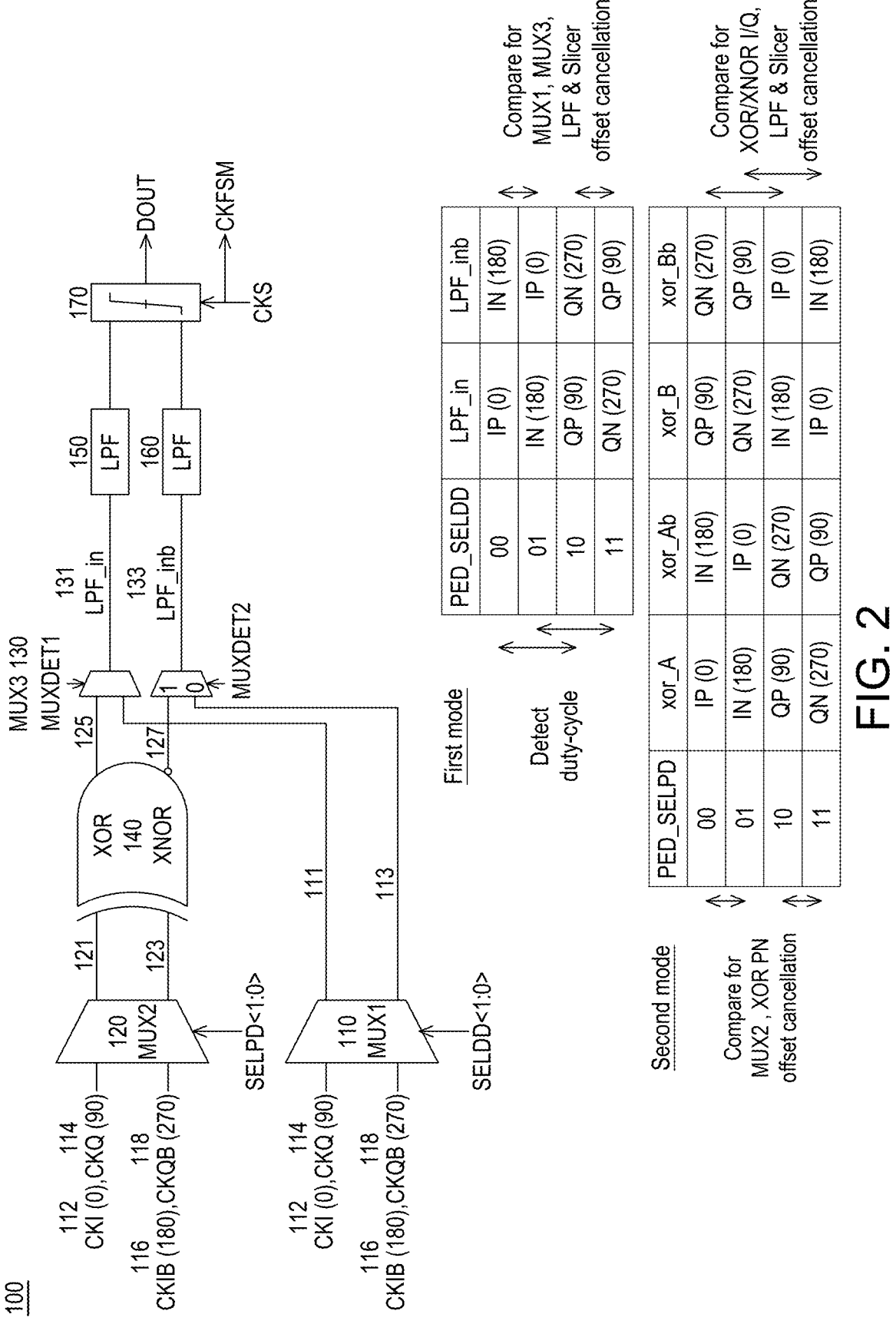
FIG. 2 illustrates an example schematic circuit diagram for duty-cycle and phase error detector (DPED) with chopping cancellation operation in accordance with some embodiments.
Figure 3:
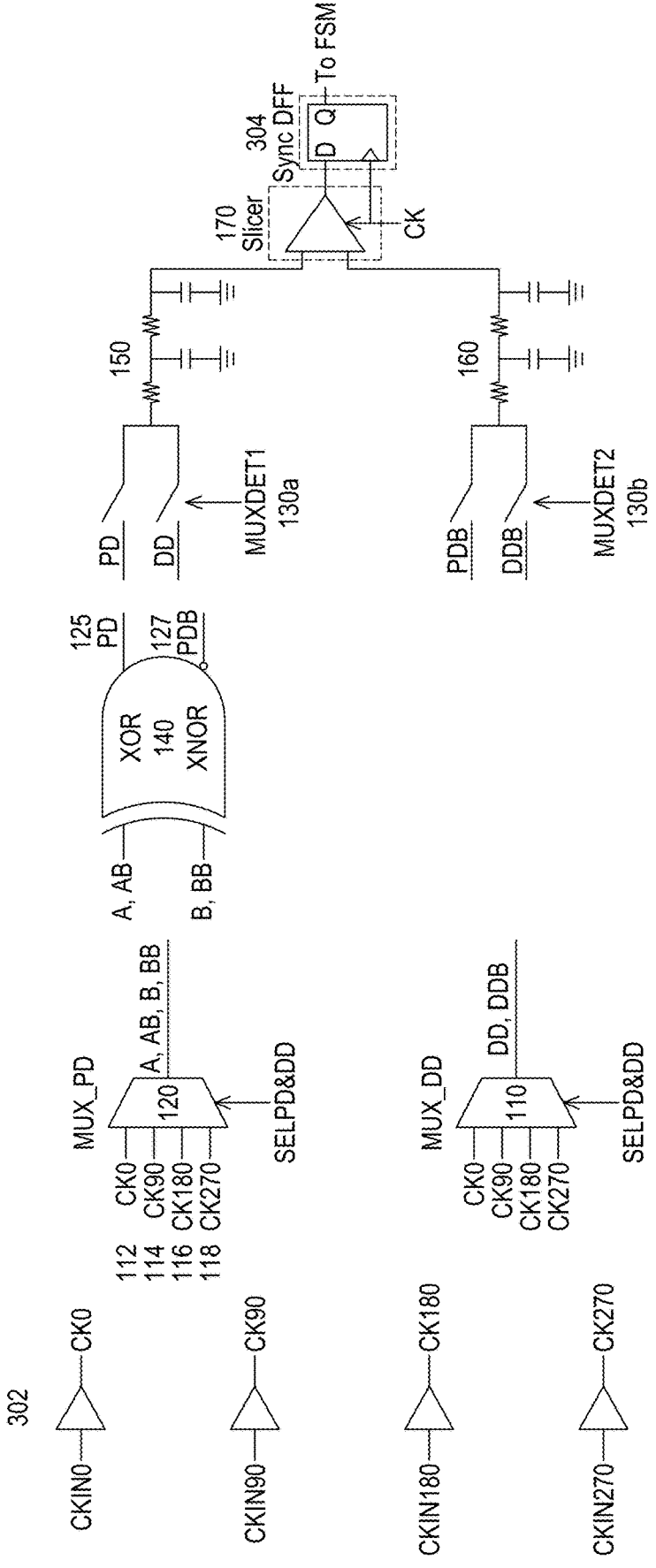
FIG. 3 illustrates example components for duty-cycle and phase error detector (DPED) with chopping cancellation of the circuit of FIG. 1, in accordance with some embodiments of the present disclosure.
Figure 4:
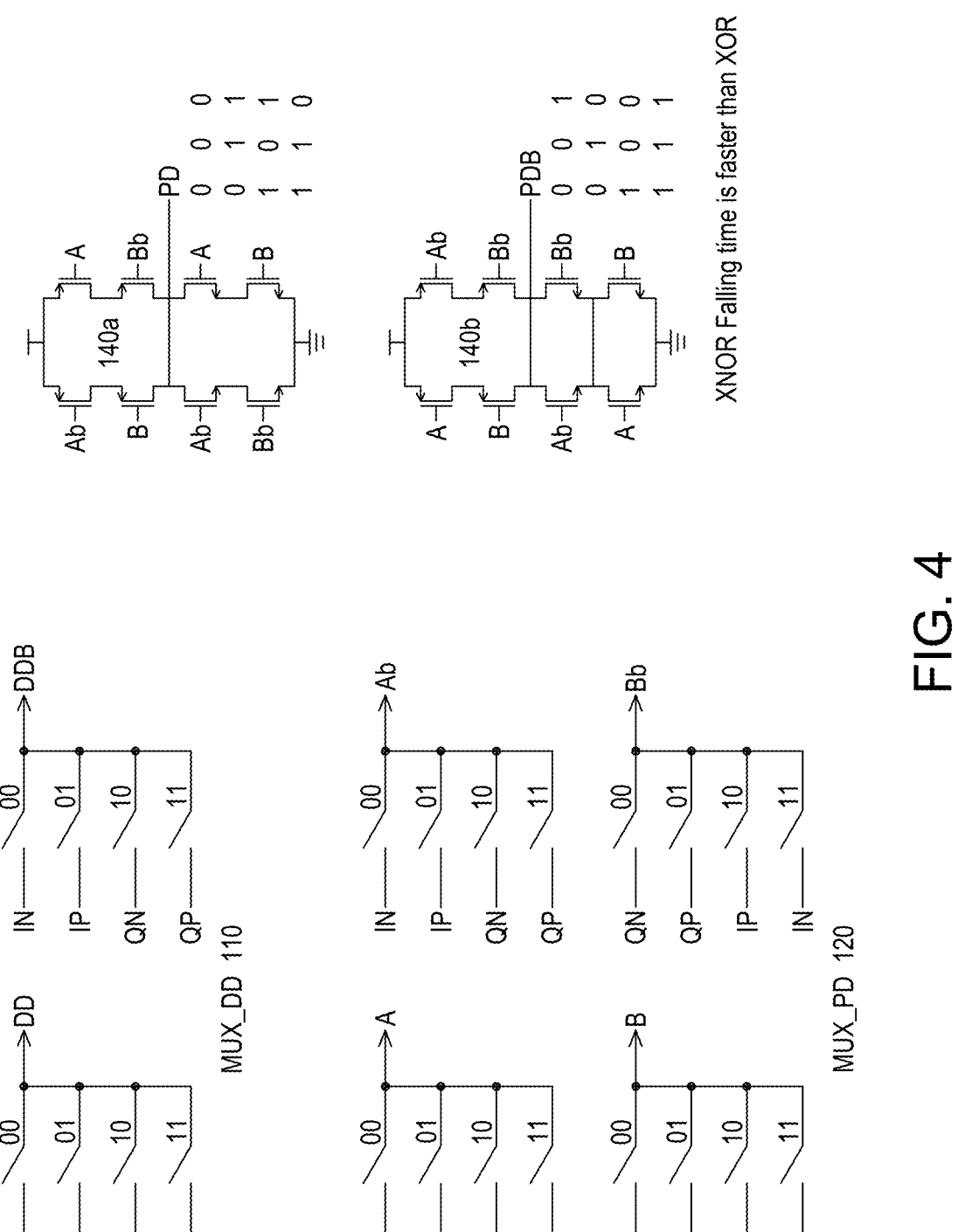
FIG. 4 illustrates example components for duty-cycle and phase error detector (DPED) with chopping cancellation of the circuit of FIG. 1, in accordance with some embodiments of the present disclosure.

FIG. 2 illustrates an example schematic circuit diagram for duty-cycle and phase error detector (DPED) with chopping cancellation operation in accordance with some embodiments. The circuit 100 may include a first multiplexer 110, a second multiplexer 120, a combination of logic gates 140, a third multiplexer 130, a first low-pass filter (LPF) 150, and a second low-pass filter (LPF) 160. The circuit 100 of FIG. 2 is substantially similar to the circuit 100 of FIG. 1, except that the respective phases of the first to fourth clock signals 112, 114, 116, 118. The specific operations of similar elements, which are already discussed in detail in above paragraphs, are omitted herein for the sake of brevity, unless there is a need to introduce the co-operation relationship with the elements shown in FIG. 2. FIGS. 3 and 4 illustrate example components for duty-cycle and phase error detector (DPED) with chopping cancellation of the circuit of FIG. 1, in accordance with some embodiments of the present disclosure.

In some embodiments, the first multiplexer (MUX1, MUX_DD) 110 can be configured to receive a first clock signal (e.g., CKI, CKO, IP) 112 with a 0° phase, a second clock signal (e.g., CKQ, CK90, QP) 114 with a 90° phase, a third clock signal (e.g., CKIB, CK180, IN) 116 with a 180° phase, and a fourth clock signal (e.g., CKQB, CK270, QN) 118 with a 270° phase. The first multiplexer 110 may select a first plurality of the first to fourth clock signals 112, 114, 116, 118 as a first output 111 and a second output 113, respectively. Respective phases of the first to fourth clock signals can be related to each other. In some embodiments, the first clock signal 112 can be 0° or 0 cycle. The second clock signal 114 can be 90° or ¼ cycle. The third clock signal 116 can be 180° or ½ cycle. The fourth clock signal 118 can be 270° or ¾ cycle. In some embodiments, the first multiplexer 110 can be an electronic device that selects one or more of several input signals and forwards the selected input(s). The first multiplexer 110 can be used in various applications to manage multiple data lines 112, 114, 116, 118 that may need to connect to a single processing unit or data stream. The selection of the input line can be controlled by additional inputs known as select lines (e.g., SELDD<1:0>, SELPD, DD). These select lines may determine which input can be connected to the output 111, 113.

In some embodiments, the second multiplexer (MUX2, MUX_PD) 120 can be configured to receive the first clock signal (e.g., CKI, CKO, IP) 112 with a 0° phase, the second clock signal (e.g., CKQ, CK90, QP) 114 with a 90° phase, the third clock signal (e.g., CKIB, CK180, IN) 116 with a 180° phase, and the fourth clock signal (e.g., CKQB, CK270, QN) 118 with a 270° phase. The second multiplexer 120 may select a second plurality 121, 123 of the first to fourth clock signals 112, 114, 116, 118, respectively. Respective phases of the first to fourth clock signals can be related to each other. In some embodiments, the first clock signal 112 can be 0° or 0 cycle. The second clock signal 114 can be 90° or ¼ cycle. The third clock signal 116 can be 180° or ½ cycle. The fourth clock signal 118 can be 270° or ¾ cycle. The second multiplexer 120 can be used in various applications to manage multiple data lines 112, 114, 116, 118 that may need to connect to a single processing unit or data stream. The selection of the input line can be controlled by additional inputs known as select lines (e.g., SELPD<1:0>, SELPD, DD). These select lines may determine which input can be connected to the output 121, 123.

In some embodiments, the combination of logic gates 140 may comprise a first logic gate 140a and a second logic gate 140b. In some embodiments, the first logic gate 140a can be an exclusive OR (XOR) gate that outputs true or 1 only when two binary bit inputs to the XOR gate are unequal. The second logic gate 140b can be an exclusive NOR (XNOR) gate that outputs true or 1 only when two binary inputs to the XNOR are equal.

In some embodiments, the circuit 100 (e.g., DPED) can be configured in two modes (e.g., first mode and second mode). In some embodiments, when configured in a first mode (e.g., duty-cycle error detector mode) to detect respective duty cycles of the first to fourth clock signals, the first multiplexer 110 can be activated, and the second multiplexer 120 and the combination of logic gates 140 can be deactivated. In some embodiments, when configured in a second mode (e.g., phase error detector mode) to detect the respective phases of the first to fourth clock signals, the second multiplexer 120 and the combination of logic gates 130 can be activated, and the first multiplexer 110 can be deactivated.

In some embodiments, the first mode can be a duty-cycle error detector mode. The first mode may comprise a first phase (e.g., 00), a second phase (e.g., 01), a third phase (e.g., 10), and a fourth phase (e.g., 11).

During the first phase (e.g., 00), the first multiplexer 110 may select the first clock signal (e.g., IP(0)) 112 and the third clock signal (e.g., IN(180)) 116, respectively. The phase of the first clock signal is 0° and the phase of the third clock signal is 180°. The first clock signal 112 can be the first output 111. The third clock signal 116 can be the second output 113.

Under the first phase (e.g., 00) of the first mode (e.g., duty-cycle error detector mode), the third multiplexer (MUX3) 130 can be configured to receive the receive the first output 111 and the second output 113. The third multiplexer 130 may select the first 111 and second outputs 113. In some embodiments, the MUXDET1 130a can be configured to receive the first output 111. The MUXDET1 130a may select the first output (e.g., IP(0)) 111 as the fifth output (e.g., LPF_in) 131. The MUXDET1 130a may provide the fifth output 131 to the first low-pass (LPF) 150. In some embodiments, the MUXDET2 130b can be configured to receive the second output 113. The MUXDET2 130b may select the second output (e.g., IN(180)) 113 as the sixth output (e.g., LPF_inb) 133. The MUXDET2 130b may provide the sixth output 133 to the second low-pass (LPF) 160. The selection of the input line can be controlled by additional inputs known as select lines. In some embodiments, the signals (e.g., average DC value of IP(0) from the first LPF 150, and average DC value of IN(180) from the second LPF 160) from the two LPFs can be compared by a feedback circuit (e.g., operation amplifier, slicer). The feedback circuit may correct/modify/adjust the duty cycle of the signals.

During the second phase (e.g., 01), the first multiplexer 110 may select the third clock signal (e.g., IN(180)) 116 and the first clock signal (e.g., IP(0)) 112, respectively. The phase of the third clock signal is 180° and the phase of the first clock signal is 0°. The third clock signal 116 can be the first output 111. The first clock signal 112 can be the second output 113.

Under the second phase (e.g., 01) of the first mode (e.g., duty-cycle error detector mode), the third multiplexer (MUX3) 130 can be configured to receive the receive the first output 111 and the second output 113. The third multiplexer 130 may select the first 111 and second outputs 113. In some embodiments, the MUXDET1 130a can be configured to receive the first output 111. The MUXDET1 130a may select the first output (e.g., IN(180)) 111 as the fifth output (e.g., LPF_in) 131. The MUXDET1 130a may provide the fifth output 131 to the first low-pass (LPF) 150. In some embodiments, the MUXDET2 130b can be configured to receive the second output 113. The MUXDET2 130b may select the second output (e.g., IP(0)) 113 as the sixth output (e.g., LPF_inb) 133. The MUXDET2 130b may provide the sixth output 133 to the second low-pass (LPF) 160. The selection of the input line can be controlled by additional inputs known as select lines. In some embodiments, the signals (e.g., average DC value of IN(180) from the first LPF 150, and average DC value of IP(0) from the second LPF 160) from the two LPFs can be compared by a feedback circuit (e.g., operation amplifier, slicer). The feedback circuit may correct/modify/adjust the duty cycle of the signals.

During the third phase (e.g., 10), the first multiplexer 110 may select the second clock signal (e.g., QP(90)) 114 and the fourth clock signal (e.g., QN(270)) 118, respectively. The phase of the second clock signal is 90° and the phase of the fourth clock signal is 270°. The second clock signal 114 can be the first output 111. The fourth clock signal 118 can be the second output 113.

Under the third phase (e.g., 10) of the first mode (e.g., duty-cycle error detector mode), the third multiplexer (MUX3) 130 can be configured to receive the receive the first output 111 and the second output 113. The third multiplexer 130 may select the first 111 and second outputs 113. In some embodiments, the MUXDET1 130a can be configured to receive the first output 111. The MUXDET1 130a may select the first output (e.g., QP(90)) 111 as the fifth output (e.g., LPF_in) 131. The MUXDET1 130a may provide the fifth output 131 to the first low-pass (LPF) 150. In some embodiments, the MUXDET2 130b can be configured to receive the second output 113. The MUXDET2 130b may select the second output (e.g., QN(270)) 113 as the sixth output (e.g., LPF inb) 133. The MUXDET2 130b may provide the sixth output 133 to the second low-pass (LPF) 160. The selection of the input line can be controlled by additional inputs known as select lines. In some embodiments, the signals (e.g., average DC value of QP(90) from the first LPF 150, and average DC value of QN(270) from the second LPF 160) from the two LPFs can be compared by a feedback circuit (e.g., operation amplifier, slicer). The feedback circuit may correct/modify/adjust the duty cycle of the signals.

During the fourth phase (e.g., 11), the first multiplexer 110 may select the fourth clock signal (e.g., QN(270)) 118 and the second clock signal (e.g., QP(90)) 114, respectively. The phase of the fourth clock signal is 270° and the phase of the second clock signal is 90°. The fourth clock signal 118 can be the first output 111. The second clock signal 114 can be the second output 113.

Under the fourth phase (e.g., 11) of the first mode (e.g., duty-cycle error detector mode), the third multiplexer (MUX3) 130 can be configured to receive the receive the first output 111 and the second output 113. The third multiplexer 130 may select the first 111 and second outputs 113. In some embodiments, the MUXDET1 130a can be configured to receive the first output 111. The MUXDET1 130a may select the first output (e.g., QN(270)) 111 as the fifth output (e.g., LPF_in) 131. The MUXDET1 130a may provide the fifth output 131 to the first low-pass filter (LPF) 150. In some embodiments, the MUXDET2 130b can be configured to receive the second output 113. The MUX-DET2 130b may select the second output (e.g., QP(90)) 113 as the sixth output (e.g., LPF_inb) 133. The MUXDET2 130*b* may provide the sixth output 133 to the second low-pass filter (LPF) 160. The selection of the input line can be controlled by additional inputs known as select lines. In some embodiments, the signals (e.g., average DC value of QN(270) from the first LPF 150, and average DC value of QP(90) from the second LPF 160) from the two LPFs can be compared by a feedback circuit (e.g., operation amplifier, slicer). The feedback circuit may correct/modify/adjust the duty cycle of the signals.

Under the duty-cycle error detector mode, the circuit 100 operates to determine the precision of signals' duty cycles by analyzing their average direct current (DC) values. This method ensures that signals maintain their intended temporal characteristics throughout their operation. Specifically, the circuit 100 performs a series of comparisons between different phases to ensure accuracy and stability: comparing phase 00 with phase 01 (and phase 10 with phase 11) allows the circuit to cancel out any offsets that might affect components such as MUX1, MUX3, the low-pass filters (LPFs), and/or the slicer. Additionally, by comparing phase 00 with phase 10, and phase 01 with phase 11, the circuit 100 efficiently detects and adjusts the duty cycles of the signals. These comparisons are essential for fine-tuning the system to handle various signal conditions and to maintain the integrity of signal processing within an electronic system.

In some embodiments, the second mode can be a phase error detector mode. The second mode may comprise a fifth phase (e.g., 00), a sixth phase (e.g., 01), a seventh phase (e.g., 10), and an eighth phase (e.g., 11).

During the fifth phase (e.g., 00), the first logic gate (XOR gate) 130*a* may output the third output 125. The third output 125 can be an XOR'ed signal of the first clock signal (e.g., IP(0)) 112 and the second clock signal (e.g., QP(90)) 114. The phase of the first clock signal is 0° and the phase of the second clock signal is 90°. In certain embodiments, the first logic gate (XOR gate) 130*a* outputs the third output 125 based on four signals (e.g., xor_A (IP(0)), xor_Ab (IN (180)), xor_B (QP(90)), and xor_Bb (QN(270))) and a Fourier differential operation. The third output 125 can be an XOR'ed signal of the signals (e.g., the xor_A (IP(0)), xor_Ab (IN(180)), xor_B (QP(90)), and xor_Bb (QN (270))).

During the fifth phase (e.g., 00), the second logic gate (XNOR gate) 130*b* may output the fourth output 127. The fourth output 127 can be a XNOR'ed signal of the first clock signal (e.g., IP(0)) 112 and the second clock signal (e.g., QP(90)) 114. The phase of the first clock signal is 0° and the phase of the second clock signal is 90°. In certain embodiments, the second logic gate (XNOR gate) 130*b* outputs the fourth output 127 based on four signals (e.g., xor_A (IP(0)), xor_Ab (IN(180)), xor_B (QP(90)), and xor_Bb (QN(270))) and a Fourier differential operation. The fourth output 127 can be an XNOR'ed signal of the signals (e.g., xor_A (IP(0)), xor_Ab (IN(180)), xor_B (QP(90)), and xor_Bb (QN(270))).

Under the fifth phase (e.g., 00) of the second mode (e.g., phase error detector mode), the third multiplexer (MUX3) 130 can be configured to receive the receive the third output 125 and the fourth output 127. The third multiplexer 130 may select the third output 125 and the fourth output 127. In some embodiments, the MUXDET1 130*a* can be configured to receive the third output 125. The MUXDET1 130*a* may select the third output (e.g., XOR'ed signal of IP(0) and QP(90)) 125 as the fifth output (e.g., LPF_in) 131. The MUXDET1 130*a* may provide the fifth output 131 to the first low-pass filter (LPF) 150. In some embodiments, the MUXDET2 130*b* can be configured to receive the fourth output 127. The MUXDET2 130*b* may select the fourth output (e.g., XNOR'ed signal of IP(0) and QP(90)) 127 as the sixth output (e.g., LPF_inb) 133. The MUXDET2 130*b* may provide the sixth output 133 to the second low-pass filter (LPF) 160. The selection of the input line can be controlled by additional inputs known as select lines. In some embodiments, the signals (e.g., average DC value of XOR'ed signal of IP(0) and QP(90) from the first LPF 150, and average DC value of XNOR'ed signal of IP(0) and QP(90) from the second LPF 160) from the two LPFs can be compared by a feedback circuit (e.g., slicer). The feedback circuit may correct/modify/adjust delay time of the signals (e.g., by a quadrature error corrector (QEC)).

During the sixth phase (e.g., 01), the first logic gate (XOR gate) 130*a* may output the third output 125. The third output 125 can be an XOR'ed signal of the third clock signal (e.g., IN(180)) 116 and the fourth clock signal (e.g., QN(270)) 118. The phase of the third clock signal is 180° and the phase of the fourth clock signal is 270°. In certain embodiments, the first logic gate (XOR gate) 130*a* outputs the third output 125 based on four signals (e.g., xor_A (IN(180)), xor_Ab (IP(0)), xor_B (QN(270)), and xor_Bb (QP(90))) and a Fourier differential operation. The third output 125 can be an XOR'ed signal of the signals (e.g., xor_A (IN(180)), xor_Ab (IP(0)), xor_B (QN(270)), and xor_Bb (QP(90))).

During the sixth phase (e.g., 01), the second logic gate (XNOR gate) 130*b* may output the fourth output 127. The fourth output 127 can be a XNOR'ed signal of the third clock signal (e.g., IN(180)) 116 and the fourth clock signal (e.g., QN(270)) 118. The phase of the third clock signal is 180° and the phase of the fourth clock signal is 270°. In certain embodiments, the second logic gate (XNOR gate) 130*b* outputs the fourth output 127 based on four signals (e.g., xor_A (IN(180)), xor_Ab (IP(0)), xor_B (QN(270)), and xor_Bb (QP(90))) and a Fourier differential operation. The fourth output 127 can be an XNOR'ed signal of the signals (e.g., xor_A (IN(180)), xor_Ab (IP(0)), xor_B (QN (270)), and xor_Bb (QP(90))).

Under the sixth phase (e.g., 01) of the second mode (e.g., phase error detector mode), the third multiplexer (MUX3) 130 can be configured to receive the receive the third output 125 and the fourth output 127. The third multiplexer 130 may select the third output 125 and the fourth output 127. In some embodiments, the MUXDET1 130*a* can be configured to receive the third output 125. The MUXDET1 130*a* may select the third output (e.g., XOR'ed signal of IN(180) and QN(270)) 125 as the fifth output (e.g., LPF_in) 131. The MUXDET1 130*a* may provide the fifth output 131 to the first low-pass filter (LPF) 150. In some embodiments, the MUXDET2 130*b* can be configured to receive the fourth output 127. The MUXDET2 130*b* may select the fourth output (e.g., XNOR'ed signal of IN(180) and QN(270)) 127 as the sixth output (e.g., LPF_inb) 133. The MUXDET2 130*b* may provide the sixth output 133 to the second low-pass filter (LPF) 160. The selection of the input line can be controlled by additional inputs known as select lines. In some embodiments, the signals (e.g., average DC value of XOR'ed signal of IN(180) and QN(270) from the first LPF 150, and average DC value of XNOR'ed signal of IN(180) and QN(270) from the second LPF 160) from the two LPFs can be compared by a feedback circuit (e.g., slicer). The feedback circuit may correct/modify/adjust delay time of the signals (e.g., by a quadrature error corrector (QEC)).

During the seventh phase (e.g., 10), the first logic gate (XOR gate) 130*a* may output the third output 125. The third output 125 can be an XOR'ed signal of the second clock signal (e.g., QP(90)) 114 and the third clock signal (e.g., IN(180)) 116. The phase of the second clock signal is 90° and the phase of the third clock signal is 180°. In certain embodiments, the first logic gate (XOR gate) 130a outputs the third output 125 based on four signals (e.g., xor_A (QP(90)), xor_Ab (QN(270)), xor_B (IN(180)), and xor_Bb (IP(0))) and a Fourier differential operation. The third output 125 can be an XOR'ed signal of the signals (e.g., xor_A (QP(90)), xor_Ab (QN(270)), xor_B (IN(180)), and xor_Bb (IP(0))).

During the seventh phase (e.g., 10), the second logic gate (XNOR gate) 130b may output the fourth output 127. The fourth output 127 can be a XNOR'ed signal of the second clock signal (e.g., QP(90)) 114 and the third clock signal (e.g., IN(180)) 116. The phase of the second clock signal is 90° and the phase of the third clock signal is 180°. In certain embodiments, the second logic gate (XNOR gate) 130b outputs the fourth output 127 based on four signals (e.g., xor_A (QP(90)), xor_Ab (QN(270)), xor_B (IN(180)), and xor_Bb (IP(0))) and a Fourier differential operation. The fourth output 127 can be an XNOR'ed signal of the signals (e.g., xor_A (QP(90)), xor_Ab (QN(270)), xor_B (IN(180)), and xor_Bb (IP(0))).

Under the seventh phase (e.g., 10) of the second mode (e.g., phase error detector mode), the third multiplexer (MUX3) 130 can be configured to receive the receive the third output 125 and the fourth output 127. The third multiplexer 130 may select the third output 125 and the fourth output 127. In some embodiments, the MUXDET1 130a can be configured to receive the third output 125. The MUXDET1 130a may select the third output (e.g., XOR'ed signal of QP(90) and IN(180)) 125 as the fifth output (e.g., LPF_in) 131. The MUXDET1 130a may provide the fifth output 131 to the first low-pass filter (LPF) 150. In some embodiments, the MUXDET2 130b can be configured to receive the fourth output 127. The MUXDET2 130b may select the fourth output (e.g., XNOR'ed signal of QP(90) and IN(180)) 127 as the sixth output (e.g., LPF_inb) 133. The MUXDET2 130b may provide the sixth output 133 to the second low-pass filter (LPF) 160. The selection of the input line can be controlled by additional inputs known as select lines. In some embodiments, the signals (e.g., average DC value of XOR'ed signal of QP(90) and IN(180) from the first LPF 150, and average DC value of XNOR'ed signal of QP(90) and IN(180) from the second LPF 160) from the two LPFs can be compared by a feedback circuit (e.g., slicer). The feedback circuit may correct/modify/adjust delay time of the signals (e.g., by a quadrature error corrector (QEC)).

During the eighth phase (e.g., 11), the first logic gate (XOR gate) 130a may output the third output 125. The third output 125 can be an XOR'ed signal of the fourth clock signal (e.g., QN(270)) 118 and the first clock signal (e.g., IP(0)) 112. The phase of the fourth clock signal is 270° and the phase of the first clock signal is 0°. In certain embodiments, the first logic gate (XOR gate) 130a outputs the third output 125 based on four signals (e.g., xor_A (QN(270)), xor_Ab (QP(90)), xor_B (IP(0)), and xor_Bb (IN(180))) and a Fourier differential operation. The third output 125 can be an XOR'ed signal of the signals (e.g., xor_A (QN(270)), xor_Ab (QP(90)), xor_B (IP(0)), and xor_Bb (IN(180))).

During the eighth phase (e.g., 11), the second logic gate (XNOR gate) 130b may output the fourth output 127. The fourth output 127 can be a XNOR'ed signal of the fourth clock signal (e.g., QN(270)) 118 and the first clock signal (e.g., IP(0)) 112. The phase of the fourth clock signal is 270° and the phase of the first clock signal is 0°. In certain embodiments, the second logic gate (XNOR gate) 130b outputs the fourth output 127 based on four signals (e.g., xor_A (QN(270)), xor_Ab (QP(90)), xor_B (IP(0)), and xor_Bb (IN(180))) and a Fourier differential operation. The fourth output 127 can be an XNOR'ed signal of the signals (e.g., xor_A (QN(270)), xor_Ab (QP(90)), xor_B (IP(0)), and xor_Bb (IN(180))).

Under the eighth phase (e.g., 11) of the second mode (e.g., phase error detector mode), the third multiplexer (MUX3) 130 can be configured to receive the receive the third output 125 and the fourth output 127. The third multiplexer 130 may select the third output 125 and the fourth output 127. In some embodiments, the MUXDET1 130a can be configured to receive the third output 125. The MUXDET1 130a may select the third output (e.g., XOR'ed signal of QN(270) and IP(0)) 125 as the fifth output (e.g., LPF_in) 131. The MUXDET1 130a may provide the fifth output 131 to the first low-pass filter (LPF) 150. In some embodiments, the MUXDET2 130b can be configured to receive the fourth output 127. The MUXDET2 130b may select the fourth output (e.g., XNOR'ed signal of QN(270) and IP(0)) 127 as the sixth output (e.g., LPF_inb) 133. The MUXDET2 130b may provide the sixth output 133 to the second low-pass filter (LPF) 160.

The selection of the input line can be controlled by additional inputs known as select lines. In some embodiments, the signals (e.g., average DC value of XOR'ed signal of QN(270) and IP(0) from the first LPF 150, and average DC value of XNOR'ed signal of QN(270) and IP(0) from the second LPF 160) from the two LPFs can be compared by a feedback circuit (e.g., slicer). The feedback circuit may correct/modify/adjust delay time of the signals (e.g., by a quadrature error corrector (QEC)).

Under the phase error detector mode, the circuit 100 operates to determine the precision of signals' phases by analyzing the average direct current (DC) values of XOR'ed and XNOR'ed signals. This method ensures that signals maintain their intended temporal characteristics throughout their operation. In some embodiments, the falling time of the XNOR may be faster than that of the XOR. Specifically, the circuit 100 performs a series of comparisons between different phases to ensure accuracy and stability: comparing phase 00 with phase 01, and phase 10 with phase 11, allows the circuit to cancel out any offsets that might affect components such as MUX2 and XOR PN. Additionally, by comparing phase 00 with phase 10, and phase 01 with phase 11, the circuit 100 efficiently cancels out any offsets that might affect other components such as the XOR gate, XNOR gate, I/Q, LPF, and/or slicer. These comparisons are essential for fine-tuning the system to handle various signal conditions and to maintain the integrity of signal processing within the electronic system.

In some embodiments, the circuit 100 may include a buffer 302 and a synchronous D-type flip-flop (DFF) 304. The buffer 302 can be a device that functions mainly to provide a driving capability to signals (e.g., CKIN0, CKIN90, CKIN180, and CKIN270) that need to travel long distances or be distributed to multiple inputs without degrading. The buffer 302 may amplify the current capacity of signals (e.g., CKIN0, CKIN90, CKIN180, and CKIN270) while maintaining the voltage level, ensuring that the signals can drive the inputs of subsequent logic gates effectively. The synchronous DFF 304 can be a type of digital memory circuit used in electronic systems to store one bit of data. It is called "synchronous" because its operations (setting and resetting) are coordinated by an external clock signal. This means the state of the DFF changes only at specific instances determined by the edges of the clock signal-typically either the rising edge (transition from low to high) or the falling edge (transition from high to low).

Figure 5:
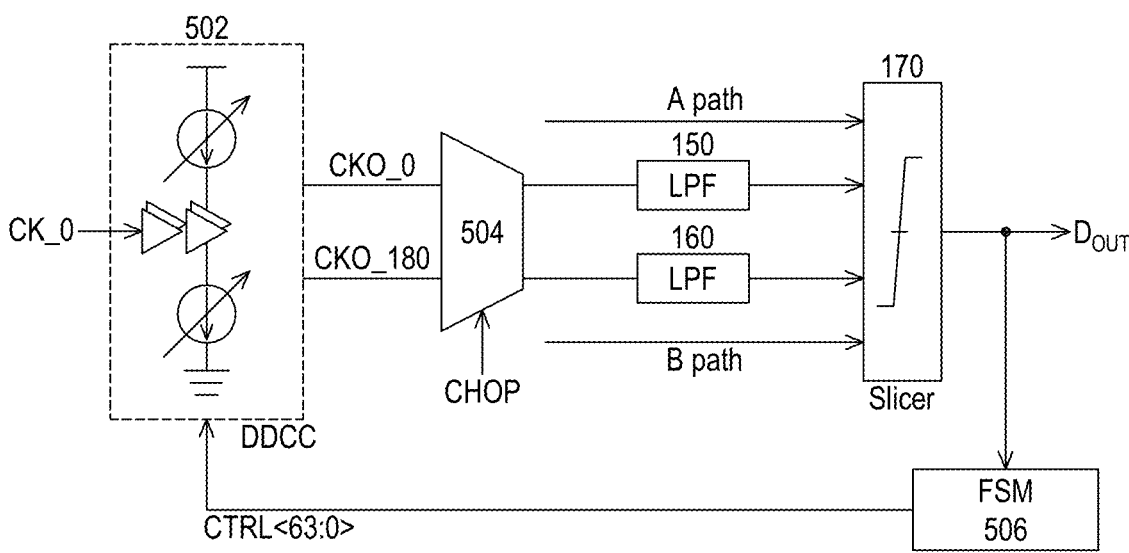
FIG. 5 illustrates an example schematic diagram for duty-cycle and phase error detector (DPED) with chopping cancellation in accordance with some embodiments.

FIG. 5 illustrates an example schematic diagram for duty-cycle and phase error detector (DPED) with chopping cancellation in accordance with some embodiments. In FIG. 5, the circuit 100 may include a differential difference current conveyor (DDCC) circuit 502, a multiplexer 504, a first low-pass filter (LPF) 150, a second low-pass filter (LPF) 160, a slicer 170, and a finite state machine (FSM) 506. The circuit 100 of FIG. 5 is substantially similar to the circuit 100 of FIGS. 1 and 2, except that the DDCC circuit 502 and the FSM 506. The specific operations of similar elements, which are already discussed in detail in above paragraphs, are omitted herein for the sake of brevity, unless there is a need to introduce the co-operation relationship with the elements shown in FIG. 5.

The DDCC circuit 502 may operate both as a conveyor of currents and as a differential amplifier. The DDCC circuit 502 can process signals by taking the difference between the voltages at its inputs and converting this voltage difference into a proportional current at the output, making the signals useful for precision analog signal manipulation. The multiplexer 504 may include the first multiplexer 110, the second multiplexer 120, the combination of logic gates 140, and/or the third multiplexer 130. The slicer 170 can be configured to receive a first DC voltage from the first LPF 150 and a second DC voltage from the second LPF 160, and provide a digital code (e.g., CTRL<63:0>) based on a voltage difference between the first DC voltage and the second DC voltage. The finite state machine (FSM) 506 configured to receive the digital code.

Figure 6:
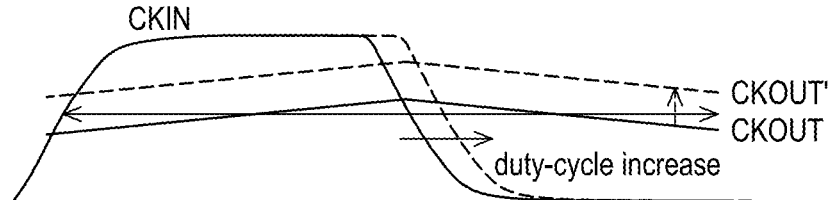
FIG. 6 illustrates example direct current (DC) values of multiple signals for analyzing duty cycle error, in accordance with some embodiments.

FIG. 6 illustrates example direct current (DC) values of multiple signals for analyzing duty cycle error, in accordance with some embodiments. FIG. 6 illustrates an approach for high-speed adjustment of the duty cycle. The concept is predicated on the relationship that the average direct current (DC) value of a signal is proportional to its duty cycle. Thus, when a signal and its inverted counterpart exhibit equal average DC values, the duty cycle of that signal is inherently at about 50%. To leverage this principle, a feedback circuit can be employed to continuously compare the average DC values of the signal and its inverse. If discrepancies are detected, the circuit 100 may actively adjust the duty cycle to maintain equilibrium, thereby ensuring the signal consistently achieves an about 50% duty cycle. The method can be effective for applications requiring precise signal timing and symmetry.

Figure 7:
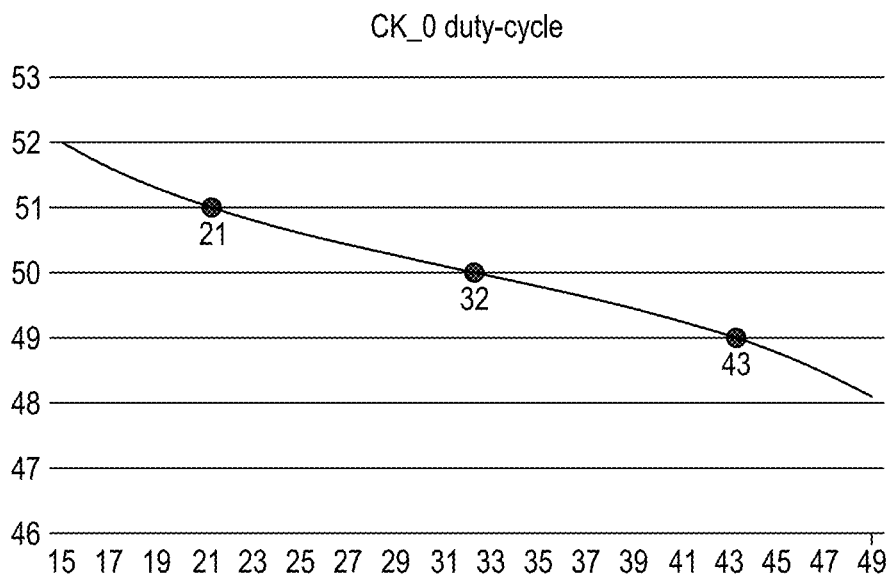
FIG. 7 illustrates example direct current (DC) values of multiple signals for analyzing duty cycle error, in accordance with some embodiments.

FIGS. 5 and 7 demonstrate a chopping technique using a digital differential difference current conveyor (DDCC) as an example. The chopping technique effectively addresses the issue of duty-cycle distortion in signal processing. Specifically, if the output clocks, CKO_0 and CKO_180, ideally have an about 50% duty cycle but the A-path (comprising input devices of MUX 504, LPF 150, 160, and slicer 170) exhibits an about +1% duty-cycle distortion, the slicer 170 may provide a digital code (e.g., CTRL<63:0>). The slicer 170 may adjust CTRL<63:0> to a code=43, which corresponds to an about-1% adjustment, to compensate for the path mismatch. This adjustment process involves the chopping mechanism, which inverses the input signal, causing the finite state machine (FSM) 506 to shift direction. Subsequently, CTRL<63:0> may lock at code=21 to correct for the about +1% distortion. The FSM 506 may stabilize at an average value (21+43)=32, ensuring that after mismatch calibration, the duty cycle of CKO_0 can be precisely adjusted back to about 50%. This technique ensures high accuracy in duty-cycle management by dynamically compensating for variations in the signal path.

Figure 8:
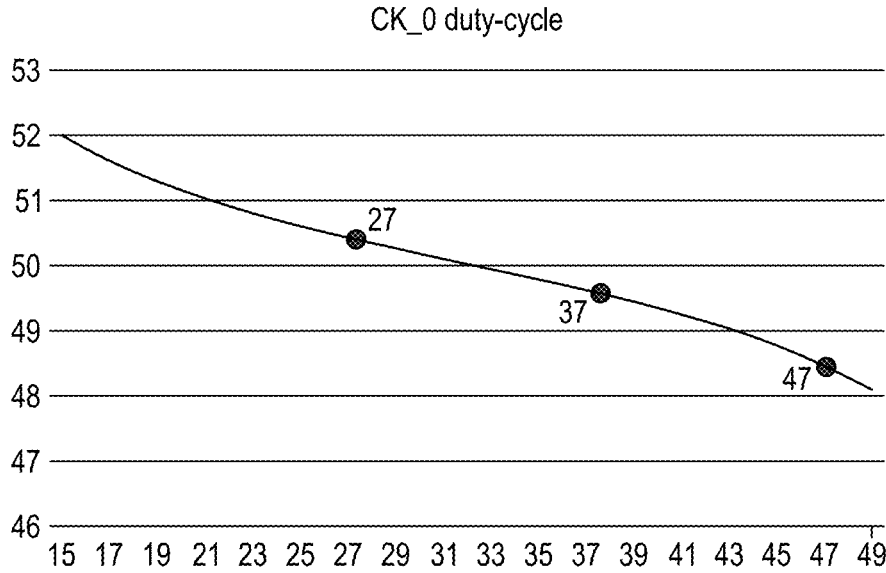
FIG. 8 illustrates example direct current (DC) values of multiple signals for analyzing duty cycle error, in accordance with some embodiments.

FIGS. 5 and 8 illustrate the use of a chopping technique in a digital differential difference current conveyor (DDCC) setup. The method is particularly effective in correcting duty-cycle errors in signal processing paths. For instance, if CKO_0 is at about 50.5% and CKO_180 is at about 49.5%, and there is an about +1% duty-cycle distortion in the A-path (which includes input devices such as MUX 504, LPF 150, 160, and slicer 170), the CTRL<63:0> may initially lock at code=47. The code adjustment may represent an about-1% compensation for the path mismatch along with an additional about-0.5% to correct the input duty error, aiming to stabilize the duty cycle. The chopping action then inverses the input, prompting the finite state machine (FSM) 506 to shift direction. Following this, CTRL<63:0> can be adjusted to code=27 to account for a further about +1% minus the residual-0.5%. Consequently, the FSM 506 may stabilize at a combined value of (27+47)=37, effectively normalizing the duty cycle of CKO_0 to about 50% (correcting from about 50.5% by subtracting about 0.5%) after the calibration for mismatch and duty error. This technique ensures that even minor discrepancies in duty cycles are accurately compensated, maintaining signal integrity and synchronization.

Figure 9:
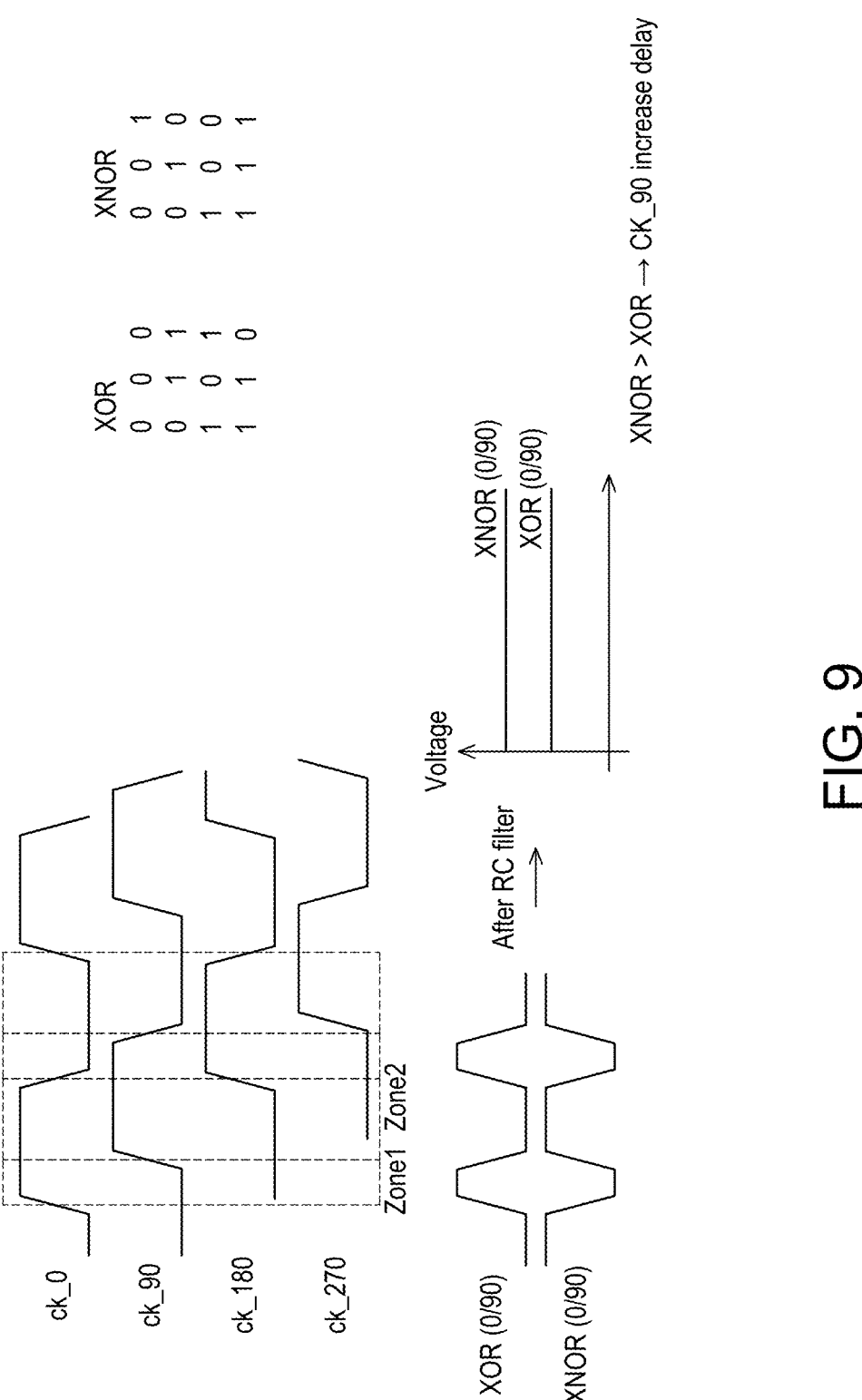
FIG. 9 illustrates example waveforms of multiple signals for analyzing phase error, in accordance with some embodiments.

FIG. 9 illustrates example waveforms of multiple signals for analyzing phase error, in accordance with some embodiments. The circuit (e.g., phase error detector) 100 may utilize the differential characteristics of CK_0 and CK_180 alongside CK_90 and CK_270 to maintain precise phase alignment in electronic circuits. All these clocks are fully differential, enhancing their noise immunity and stability. However, CK_90 and CK_270 may require adjustments to correct any phase discrepancies that may arise. The adjustment process involves comparing the voltages of these signals using a slicer 170, which determines the magnitude and direction of the necessary correction. The quadrature error corrector (QEC) may then adjust the delay time based on the slicer's output to align the phases accurately. For instance, if the voltage comparison indicates that the XNOR output is greater than the XOR output, the CK_90 may increase in delay time to correct the phase error.

FIG. 10 illustrates example waveforms of multiple signals for analyzing phase error, in accordance with some embodiments. When analyzing the phase error, the circuit 100 may operate to determine the precision of signals' phases by analyzing the average direct current (DC) values of XOR'ed and XNOR'ed signals.

During the fifth phase (e.g., 00), the first logic gate (XOR gate) 130*a* may output the third output (e.g., zone 1 and 3) 125. The third output 125 can be an XOR'ed signal of the first clock signal (e.g., IP(0)) 112 and the second clock signal (e.g., QP(90)) 114. After the third output 125 is processed by the first LPF 150, the output may represent the average DC value of XOR'ed signal of zone 1 and zone 3. During the fifth phase (e.g., 00), the second logic gate (XNOR gate) 130*b* may output the fourth output (e.g., zone 2 and 4) 127. The fourth output 127 can be a XNOR'ed signal of the first clock signal (e.g., IP(0)) 112 and the second clock signal (e.g., QP(90)) 114. After the fourth output 127 is processed by the second LPF 160, the output may represent the average DC value of XOR'ed signal of zone 2 and zone 4.

During the sixth phase (e.g., 01), the first logic gate (XOR gate) 130*a* may output the third output (e.g., zone 1 and 3) 125. The third output 125 can be an XOR'ed signal of the third clock signal (e.g., IN(180)) 116 and the fourth clock signal (e.g., QN(270)) 118. After the third output 125 is processed by the first LPF 150, the output may represent the average DC value of XOR'ed signal of zone 1 and zone 3. During the sixth phase (e.g., 01), the second logic gate (XNOR gate) 130b may output the fourth output (e.g., zone 2 and 4) 127. The fourth output 127 can be a XNOR'ed signal of the third clock signal (e.g., IN(180)) 116 and the fourth clock signal (e.g., QN(270)) 118. After the fourth output 127 is processed by the second LPF 160, the output may represent the average DC value of XOR'ed signal of zone 2 and zone 4.

During the seventh phase (e.g., 10), the first logic gate (XOR gate) 130a may output the third output (e.g., zone 2 and 4) 125. The third output 125 can be an XOR'ed signal of the second clock signal (e.g., QP(90)) 114 and the third clock signal (e.g., IN(180)) 116. After the third output 125 is processed by the first LPF 150, the output may represent the average DC value of XOR'ed signal of zone 2 and zone 4. During the seventh phase (e.g., 10), the second logic gate (XNOR gate) 130b may output the fourth output (e.g., zone 1 and 3) 127. The fourth output 127 can be a XNOR'ed signal of the second clock signal (e.g., QP(90)) 114 and the third clock signal (e.g., IN(180)) 116. After the fourth output 127 is processed by the second LPF 160, the output may represent the average DC value of XOR'ed signal of zone 1 and zone 3.

During the eighth phase (e.g., 11), the first logic gate (XOR gate) 130a may output the third output (e.g., zone 2 and 4) 125. The third output 125 can be an XOR'ed signal of the fourth clock signal (e.g., QN(270)) 118 and the first clock signal (e.g., IP(0)) 112. After the third output 125 is processed by the first LPF 150, the output may represent the average DC value of XOR'ed signal of zone 2 and zone 4. During the eighth phase (e.g., 11), the second logic gate (XNOR gate) 130b may output the fourth output (e.g., zone 1 and 3) 127. The fourth output 127 can be a XNOR'ed signal of the fourth clock signal (e.g., QN(270)) 118 and the first clock signal (e.g., IP(0)) 112. After the fourth output 127 is processed by the second LPF 160, the output may represent the average DC value of XOR'ed signal of zone 1 and zone 3.

This method ensures that signals maintain their intended temporal characteristics throughout their operation. In some embodiments, the falling time of the XNOR may be faster than that of the XOR. Specifically, the circuit 100 may perform a series of comparisons between different phases to ensure accuracy and stability: comparing phase 00 with phase 01, and phase 10 with phase 11, allows the circuit to cancel out any offsets that might affect components such as MUX2 and XOR PN. This operation can cancel the offset caused by PN mismatches. Additionally, by comparing phase 00 with phase 10, and phase 01 with phase 11, the circuit 100 efficiently eliminates offsets that might affect other components such as the XOR gate, XNOR gate, I/Q, LPF, and/or slicer. Even when QP is exactly 90 degrees, there can be some average mismatch between zone 13 and zone 24 due to the falling time mismatch. These comparisons are essential for fine-tuning the system to handle various signal conditions and to maintain the integrity of signal processing within the electronic system.

FIG. 11 illustrates an example calibration sequence for duty-cycle and phase error detector (DPED) with chopping cancellation, in accordance with some embodiments. In some embodiments, the circuit 100 (e.g., DPED) can be configured in two modes (e.g., first mode and second mode). In some embodiments, the first mode can be a duty-cycle error detector mode. The first mode may comprise a first phase (e.g., DD<00>), a second phase (e.g., DD<01>), a third phase (e.g., DD<10>), and a fourth phase (e.g., DD<11>). In some embodiments, the second mode can be a phase error detector mode. The second mode may comprise a fifth phase (e.g., PD<00>), a sixth phase (e.g., PD<01>), a seventh phase (e.g., PD<10>), and an eighth phase (e.g., PD<11>). After completing the first phase (e.g., DD<00>) and the second phase (e.g., DD<01>), the circuit 100 may generate a first code (e.g., DCC1 codes). Subsequently, during the third phase (e.g., DD<10>) and the fourth phase (e.g., DD<11>), the circuit 100 may generate a second code (e.g., DCCs codes). At this stage, the pulse widths of the first clock signal (e.g., IP(0)) 112, the second clock signal (e.g., QP(90)), the third clock signal (e.g., IN(180)), and the fourth clock signal (e.g., QN(270)) are the same. Finally, following the fifth phase (e.g., PD<00>), sixth phase (e.g., PD<01>), seventh phase (e.g., PD<10>), and eighth phase (e.g., PD<11>), the circuit 100 may generate a third code (e.g., QEC codes), indicating that the calibration is complete/done (e.g., zone 1=zone 2=zone 3=zone 4).

Figure 12:
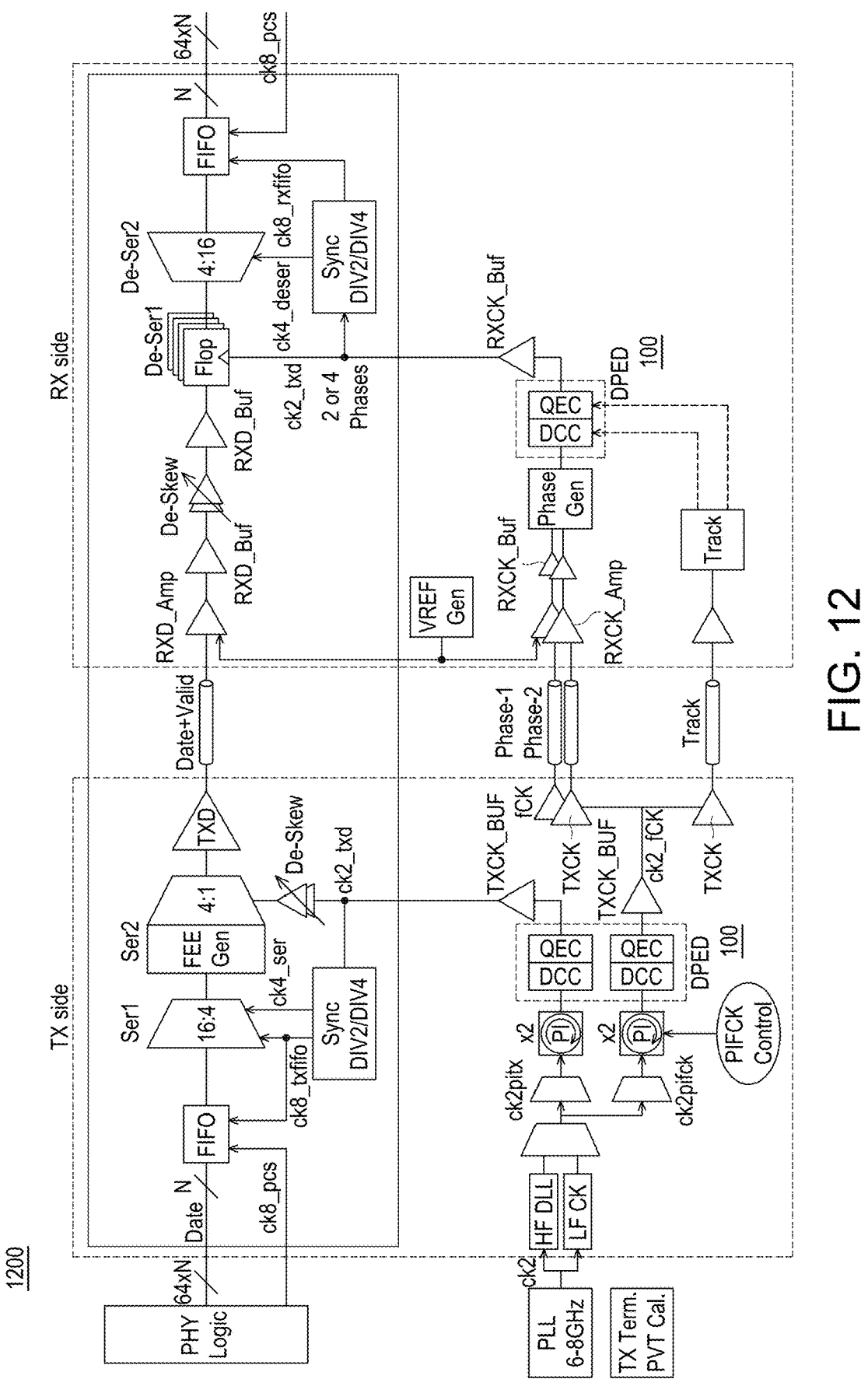
FIG. 12 illustrates an example schematic circuit diagram for duty-cycle and phase error detector (DPED) with chopping cancellation in accordance with some embodiments.
Figure 13:
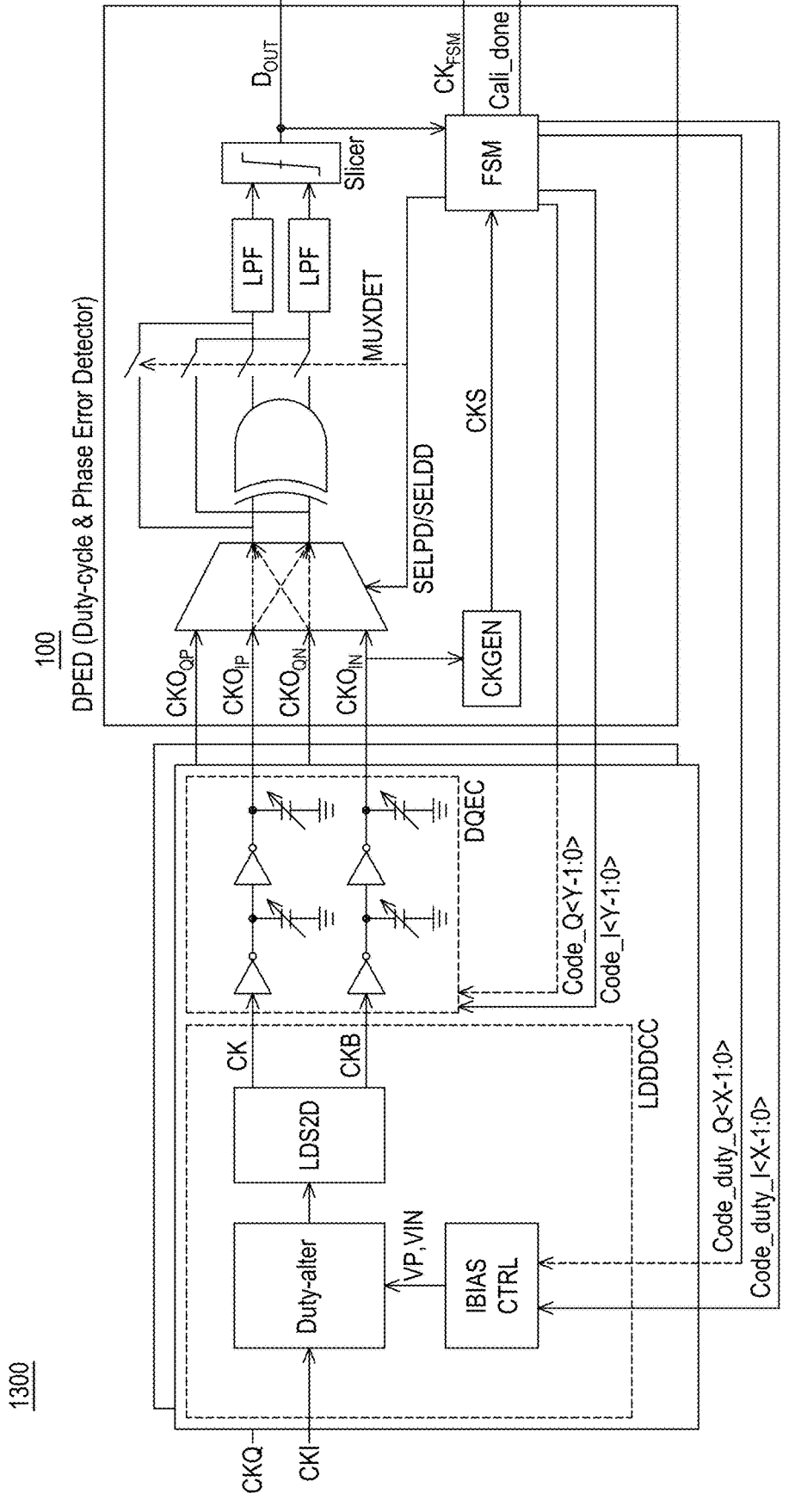
FIG. 13 illustrates an example schematic circuit diagram for duty-cycle and phase error detector (DPED) with chopping cancellation in accordance with some embodiments.
Figure 14:
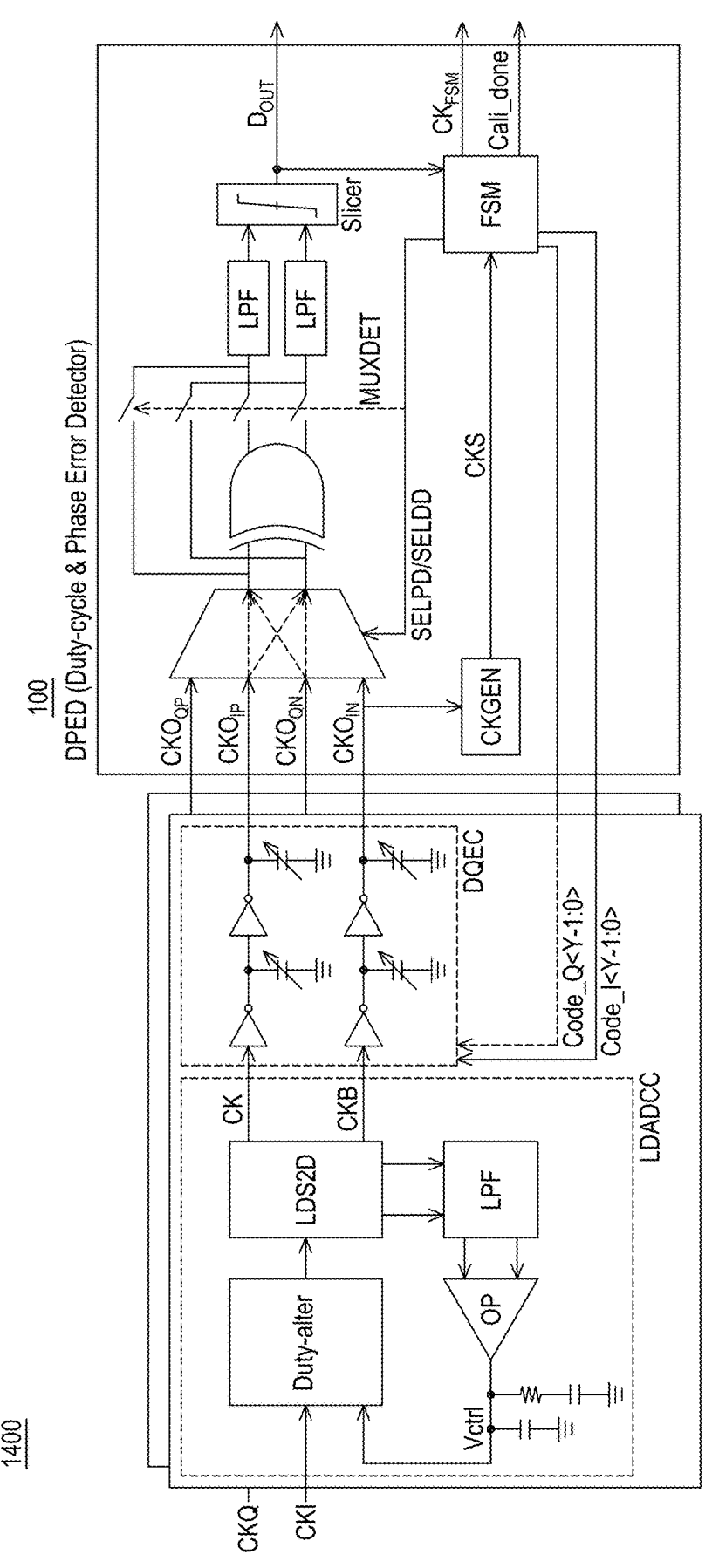
FIG. 14 illustrates an example schematic circuit diagram for duty-cycle and phase error detector (DPED) with chopping cancellation in accordance with some embodiments.

FIGS. 12, 13, and 14 illustrate implementation examples the circuit 100 of FIG. 1 in accordance with some embodiments. FIG. 12 illustrates that the circuit 100 of FIG. 1 can be incorporated into a universal chiplet interconnect express (UCIe) TX/RX architecture 1200. FIG. 13 illustrates that the circuit 100 of FIG. 1 can be incorporated into a circuit with a digital controlled duty-cycle corrector (DCC) 1300. FIG. 14 illustrates that the circuit 100 of FIG. 1 can be incorporated into a circuit with an analog controlled duty-cycle corrector (DCC) 1400. By incorporating the circuit 100 for duty-cycle and phase error detection (DPED) with chopping cancellation, the multi-chip circuit can calibrate both the duty-cycle and phase errors of two groups of differential clocks, enhancing the precision and reliability of clock signals in integrated circuits.

FIG. 15 illustrates a flow chart of an example method 1500 for operating the circuit for duty-cycle and phase error detector (DPED) with chopping cancellation of FIG. 1, in accordance with some embodiments. For example, at least some of the operations of the method 1500 can be performed to calibrate both duty-cycles and phase errors of two groups of differential clocks of the circuit 100. Thus, in the following discussion of the methods 1500, the reference numerals used in the figures above (e.g., FIGS. 1-14) may be reused. It is noted that the method 1500 is merely an example and is not intended to limit the present disclosure. Accordingly, it is understood that additional operations may be provided before, during, and after the method 1500 of FIG. 15, and that some other operations may only be briefly described herein.

The method 1500 starts with operations 1502 in which a circuit 100 may select a first pair (e.g., IP(0) and IN(180)) of first to fourth clock signals as a first output (IP(0)) 111 and a second output (IN(180)) 113, respectively, during a first mode (e.g., duty-cycle error detector mode) to detect duty cycles of a first clock signal (e.g., IP(0)) 112, a second clock signal (e.g., QP(90)) 114, a third clock signal (e.g., IN(180)) 116, and a fourth clock signal (e.g., QN(270)) 118. In some embodiments, the third multiplexer (MUX3) 130 can be configured to receive the receive the first output 111 and the second output 113. The third multiplexer 130 may select the first 111 and second outputs 113. In some embodiments, the MUXDET1 130a can be configured to receive the first output 111. The MUXDET1 130a may select the first output (e.g., IP(0)) 111 as the fifth output (e.g., LPF in) 131. The MUXDET1 130a may provide the fifth output 131 to the first low-pass filter (LPF) 150. In some embodiments, the MUXDET2 130b can be configured to receive the second output 113. The MUXDET2 130*b* may select the second output (e.g., IN(180)) 113 as the sixth output (e.g., LPF_inb) 133. The MUXDET2 130*b* may provide the sixth output 133 to the second low-pass filter (LPF) 160. The selection of the input line can be controlled by additional inputs known as select lines.

The method 1500 proceeds to operation 1504 in which the circuit 100 may filter the first output (e.g., IP(0)) and the second output (e.g., IN(180)) to provide a first direct current (DC) voltage and a second DC voltage, respectively. In some embodiments, the signals (e.g., average DC value of IP(0) from the first LPF 150, and average DC value of IN(180) from the second LPF 160) from the two LPFs can be compared by a feedback circuit (e.g., operation amplifier, slicer). The feedback circuit may correct/modify/adjust the duty cycle of the signals.

The method 1500 proceeds to operation 1506 in which the circuit 100 may XOR a second pair (e.g., IP(0) and QP(90)) of the first to fourth clock signals as a third output during a second mode (e.g., phase error detector mode) to detect phases of the first to fourth clock signals. In some embodiments, the first logic gate (XOR gate) 130*a* may output the third output 125. The third output 125 can be an XOR'ed signal of the first clock signal (e.g., IP(0)) 112 and the second clock signal (e.g., QP(90)) 114. The phase of the first clock signal is 0° and the phase of the second clock signal is 90°. In certain embodiments, the first logic gate (XOR gate) 130*a* outputs the third output 125 based on four signals (e.g., xor_A (IP(0)), xor_Ab (IN(180)), xor_B (QP(90)), and xor_Bb (QN(270))) and a Fourier differential operation. The third output 125 can be an XOR'ed signal of the signals (e.g., the xor_A (IP(0)), xor_Ab (IN(180)), xor_B (QP(90)), and xor_Bb (QN(270))).

The method 1500 proceeds to operation 1508 in which the circuit 100 may XNOR a third pair of the first to fourth clock signals as a fourth output during the second mode. In some embodiments, the second logic gate (XNOR gate) 130*b* may output the fourth output 127. The fourth output 127 can be a XNOR'ed signal of the first clock signal (e.g., IP(0)) 112 and the second clock signal (e.g., QP(90)) 114. The phase of the first clock signal is 0° and the phase of the second clock signal is 90°. In certain embodiments, the second logic gate (XNOR gate) 130*b* outputs the fourth output 127 based on four signals (e.g., xor_A (IP(0)), xor_Ab (IN(180)), xor_B (QP(90)), and xor_Bb (QN(270))) and a Fourier differential operation. The fourth output 127 can be an XNOR'ed signal of the signals (e.g., xor_A (IP(0)), xor_Ab (IN(180)), xor_B (QP(90)), and xor_Bb (QN(270))).

The method 1500 proceeds to operation 1508 in which the circuit 100 may filter the third output and the fourth output to provide the first DC voltage and the second DC voltage, respectively. In some embodiments, the third multiplexer 130 may select the third output 125 and the fourth output 127. In some embodiments, the MUXDET1 130*a* can be configured to receive the third output 125. The MUXDET1 130*a* may select the third output (e.g., XOR'ed signal of IP(0) and QP(90)) 125 as the fifth output (e.g., LPF_in) 131. The MUXDET1 130*a* may provide the fifth output 131 to the first low-pass filter (LPF) 150. In some embodiments, the MUXDET2 130*b* can be configured to receive the fourth output 127. The MUXDET2 130*b* may select the fourth output (e.g., XNOR'ed signal of IP(0) and QP(90)) 127 as the sixth output (e.g., LPF_inb) 133. The MUXDET2 130*b* may provide the sixth output 133 to the second low-pass filter (LPF) 160. The selection of the input line can be controlled by additional inputs known as select lines. In some embodiments, the signals (e.g., average DC value of XOR'ed signal of IP(0) and QP(90) from the first LPF 150, and average DC value of XNOR'ed signal of IP(0) and QP(90) from the second LPF 160) from the two LPFs can be compared by a feedback circuit (e.g., slicer). The feedback circuit may correct/modify/adjust delay time of the signals (e.g., by a quadrature error corrector (QEC)).

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first multiplexer configured to receive a first clock signal, a second clock signal, a third clock signal, and a fourth clock signal, and select a first plurality of the first to fourth clock signals as a first output and a second output, respectively, wherein respective phases of the first to fourth clock signals are related to each other;
   a second multiplexer configured to receive the first to fourth clock signals, and select a second plurality of the first to fourth clock signals;
   a combination of logic gates comprising a first logic gate and a second logic gate, wherein the combination of logic gates is coupled to the second multiplexer and configured to receive the second plurality of the first to fourth clock signals, provide a third output through the first logic gate, and provide a fourth output through the second logic gate;
   a third multiplexer configured to receive the first to fourth outputs, and select the first and second outputs or the third and fourth outputs;
   a first low-pass filter configured to provide a first direct current (DC) voltage based on the first and third outputs; and
   a second low-pass filter configured to provide a second DC voltage based on the second and fourth outputs.

2. The circuit of claim 1, wherein the first logic gate is an XOR gate, and the second logic gate is an XNOR gate.

3. The circuit of claim 1, wherein
   when configured in a first mode to detect respective duty cycles of the first to fourth clock signals, the first multiplexer is activated, with the second multiplexer and the combination of logic gates deactivated; and
   when configured in a second mode to detect the respective phases of the first to fourth clock signals, the second multiplexer and the combination of logic gates are activated, with the first multiplexer deactivated.

4. The circuit of claim 3, wherein the first mode comprises a first phase, a second phase, a third phase, and a fourth phase.

5. The circuit of claim 4, wherein during the first phase, the first output and the second output, selected by the first multiplexer, are the first clock signal and the third clock signal, respectively, wherein the phase of the first clock signal is 0° and the phase of the third clock signal is 180°;

during the second phase, the first output and the second output, selected by the first multiplexer, are the third clock signal and the first clock signal, respectively;

during the third phase, the first output and the second output, selected by the first multiplexer, are the second clock signal and the fourth clock signal, respectively, wherein the phase of the second clock signal is 90° and the phase of the fourth clock signal is 270°; and during the fourth phase, the first output and the second output, selected by the first multiplexer, are the fourth clock signal and the second clock signal, respectively.

6. The circuit of claim 3, wherein the second mode comprises a fifth phase, a sixth phase, a seventh phase, and an eighth phase.

7. The circuit of claim 6, wherein during the fifth phase, the third output, outputted by the first logic gate, is an XOR'ed signal of the first clock signal and the second clock signal, wherein the phase of the first clock signal is 0° and the phase of the second clock signal is 90°; and during the fifth phase, the fourth output, outputted by the second logic gate, is a XNOR'ed signal of the first clock signal and the second clock signal.

8. The circuit of claim 7, wherein during the sixth phase, the third output, outputted by the first logic gate, is an XOR'ed signal of the third clock signal and the fourth clock signal, wherein the phase of the third clock signal is 180° and the phase of the fourth clock signal is 270°; and during the sixth phase, the fourth output, outputted by the second logic gate, is a XNOR'ed signal of the third clock signal and the fourth clock signal.

9. The circuit of claim 8, wherein during the seventh phase, the third output, outputted by the first logic gate, is an XOR'ed signal of the second clock signal and the third clock signal; and during the seventh phase, the fourth output, outputted by the second logic gate, is a XNOR'ed signal of the second clock signal and the third clock signal.

10. The circuit of claim 9, wherein during the eighth phase, the third output, outputted by the first logic gate, is an XOR'ed signal of the fourth clock signal and the first clock signal; and during the eighth phase, the fourth output, outputted by the second logic gate, is a XNOR'ed signal of the fourth clock signal and the first clock signal.

11. The circuit of claim 1, further comprising:

a slicer configured to receive the first DC voltage and the second DC voltage, and provide a digital code based on a voltage difference between the first DC voltage and the second DC voltage; and a finite state machine configured to receive the digital code.

12. A circuit, comprising:

a first multiplexer configured to receive a first clock signal with a 0° phase, a second clock signal with a 90° phase, a third clock signal with a 180° phase, and a fourth clock signal with a 270° phase, and, when in a first mode, select a first plurality of the first to fourth clock signals as a first output and a second output, respectively;

a second multiplexer configured to receive the first to fourth clock signals, and, when in a second mode, select a second plurality of the first to fourth clock signals;

a combination of logic gates comprising a first logic gate and a second logic gate, wherein the combination of logic gates is coupled to the second multiplexer and, when in the second mode, configured to receive the second plurality of the first to fourth clock signals, provide a third output through the first logic gate, and provide a fourth output through the second logic gate;

a third multiplexer configured to receive the first to fourth outputs, and select the first and second outputs when in the first mode or the third and fourth outputs when in the fourth mode;

a first low-pass filter configured to provide a first direct current (DC) voltage based on the first and third outputs; and a second low-pass filter configured to provide a second DC voltage based on the second and fourth outputs.

13. The circuit of claim 12, wherein the first logic gate is an XOR gate, and the second logic gate is an XNOR gate.

14. The circuit of claim 12, wherein when configured in a first mode to detect respective duty cycles of the first to fourth clock signals, the first multiplexer is activated, with the second multiplexer and the combination of logic gates deactivated; and when configured in a second mode to detect the respective phases of the first to fourth clock signals, the second multiplexer and the combination of logic gates are activated, with the first multiplexer deactivated.

15. The circuit of claim 14, wherein the first mode comprises a first phase, a second phase, a third phase, and a fourth phase.

16. The circuit of claim 15, wherein during the first phase, the first output and the second output, selected by the first multiplexer, are the first clock signal and the third clock signal, respectively;

during the second phase, the first output and the second output, selected by the first multiplexer, are the third clock signal and the first clock signal, respectively;

during the third phase, the first output and the second output, selected by the first multiplexer, are the second clock signal and the fourth clock signal, respectively; and during the fourth phase, the first output and the second output, selected by the first multiplexer, are the fourth clock signal and the second clock signal, respectively.

17. The circuit of claim 14, wherein the second mode comprises a fifth phase, a sixth phase, a seventh phase, and an eighth phase.

18. The circuit of claim 17, wherein during the fifth phase, the third output, outputted by the first logic gate, is an XOR'ed signal of the first clock signal and the second clock signal; and during the fifth phase, the fourth output, outputted by the second logic gate, is a XNOR'ed signal of the first clock signal and the second clock signal.

19. The circuit of claim 12, further comprising:

a slicer configured to receive the first DC voltage and the second DC voltage, and provide a digital code based on a voltage difference between the first DC voltage and the second DC voltage; and a finite state machine configured to receive the digital code.

20. A method for operating a circuit, comprising:

selecting, by a third multiplexer of the circuit, during a first mode to detect duty cycles of a first clock signal, a second clock signal, a third clock signal, and a fourth clock signal, a first pair of the first to fourth clock signals as a first output and a second output, respectively;

filtering, by a first low-pass filter and a second low-pass filter of the circuit, the first output and the second output to provide a first direct current (DC) voltage and a second DC voltage, respectively;

XOR'ing, by a first logic gate of the circuit, during a second mode to detect phases of the first to fourth clock signals, a second pair of the first to fourth clock signals as a third output;

XNOR'ing, by a second logic gate of the circuit, during the second mode, a third pair of the first to fourth clock signals as a fourth output; and filtering, by the first low-pass filter and the second low-pass filter of the circuit, the third output and the fourth output to provide the first DC voltage and the second DC voltage, respectively.

\*     \*     \*     \*     \*